| (12) | United States Patent<br>Southworth et al. | (10) Patent No.: US 10,937,750 B1<br>(45) Date of Patent: Mar. 2, 2021 |
|---|---|---|

(54) LOW STRESS PAD STRUCTURE FOR PACKAGED DEVICES

(71) Applicant: NXP B.V., Eindhoven (NL)

(72) Inventors: Paul Southworth, Groesbeek (NL); Zhiwei Gong, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/540,342

(22) Filed: Aug. 14, 2019

(51) Int. Cl.
*H01L 23/00* (2006.01)
*H01L 21/768* (2006.01)
*H01L 23/532* (2006.01)

(52) U.S. Cl.
CPC ........ *H01L 24/08* (2013.01); *H01L 21/76871* (2013.01); *H01L 23/53238* (2013.01); *H01L 2224/0801* (2013.01)

(58) Field of Classification Search
CPC ............. H01L 2224/0401; H01L 24/13; H01L 2924/351; H01L 23/481; H01L 24/08; H01L 21/76871; H01L 23/53238; H01L 2224/0801
See application file for complete search history.

(56) References Cited

U.S. PATENT DOCUMENTS

| 6,092,280 | A | 7/2000 | Wojnarowski |
| 6,593,220 | B1* | 7/2003 | Yu ..................... H01L 21/2885 228/180.22 |
| 9,334,153 | B1 | 5/2016 | Perahia et al. |
| 2011/0063815 | A1* | 3/2011 | Lu ........................... H01L 24/05 361/803 |

FOREIGN PATENT DOCUMENTS

CN 102683274 B 4/2017

* cited by examiner

*Primary Examiner* — Jasmine J Clark

(57) ABSTRACT

Embodiments are provided for package semiconductor devices, each device including: a low stress pad structure comprising: a dielectric layer, a seed layer having: a center section, and a ring section formed around the center section and over a top surface of the dielectric layer, wherein the ring section of the seed layer includes a set of elongated openings through which a portion of the top surface of the dielectric layer is exposed, and a metal layer having: an inner section formed over a top surface of the center section of the seed layer, and an outer section formed over a top surface of the ring section of the seed layer, wherein a bottom surface of the outer section of the metal layer directly contacts the portion of the top surface of the dielectric layer exposed through the set of elongated openings.

20 Claims, 21 Drawing Sheets

LOW STRESS PAD STRUCTURE FOR PACKAGED DEVICES

BACKGROUND

Field

This disclosure relates generally to packaged devices, and more specifically, to low stress pad structures for packaged devices.

Related Art

A semiconductor die is a small integrated circuit (IC) formed on a semiconductor wafer, such as a silicon wafer. Such a die is typically cut from the wafer and packaged for protection, such as by encasing the die in plastic or other protective material. Wafer level processes produce a plurality of packages by forming one or more redistributed layers over a wafer that includes a plurality of die, where the redistributed layers provide routing from die pads to an external pad, such as a ball grid array (BGA) pad. The wafer is then singulated into packaged devices.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 1A:
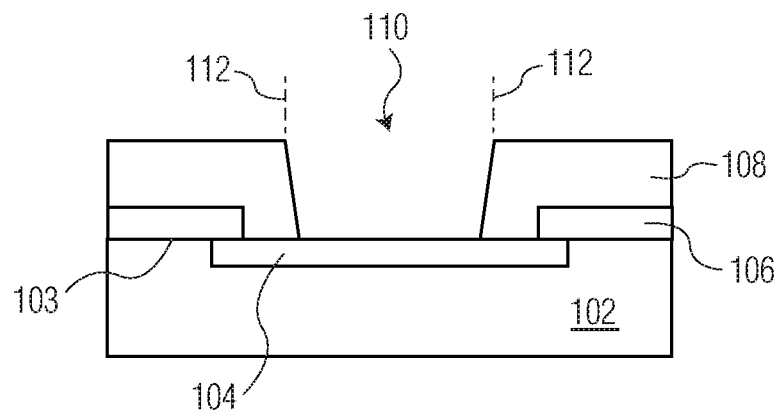
FIGS. 1A, 1B, 2A, 2B, 3A, 3B, 4A, 4B, 5A, 5B, 6A, 6B, 7A, 7B, 8A, 8B, 9, 10, and 11 are diagrams depicting an example fabrication process for implementing low stress pad structures for a packaged semiconductor device, according to some embodiments of the present disclosure.

The following sets forth a detailed description of various embodiments intended to be illustrative of the invention and should not be taken to be limiting.

Overview

Semiconductor packaging materials and processing techniques have been purposely developed with good adhesion in mind. While good adhesion positively impacts the package integrity, stresses may be introduced due to the CTE (co-efficient of thermal expansion) mismatch between the materials of the package and a carrier, such as a printed circuit board (PCB). In wafer level chip scale packages (WLCSP), a thick metal pad such as a thick copper pad may result in high stress in the package localized at the solder joint, especially at a BGA (ball grid array) landing pad formed over the active side of the die, which could damage the underlying integrated circuit of the die.

The present disclosure provides a low stress pad structure to minimize any impact on the underlying silicon device. The low stress pad structure includes a solder ball pad like a BGA (ball grid array) pad, where adhesion between the solder ball pad and the underlying dielectric material is reduced. In some embodiments, a small gap or lateral opening is formed around the solder ball pad to release the solder ball pad from the underlying dielectric material. In such embodiments, zero adhesion is achieved by the release, allowing the solder ball pad to expand and contract at a different rate than the underlying dielectric material, which reduces the risk of damage to the dielectric material as well as to the underlying integrated circuitry. In other embodiments, a reduced adhesion interface is achieved between the solder ball pad and the underlying dielectric material. In such embodiments, a seed layer is formed with elongated openings patterned into the seed layer. The solder ball pad is plated onto the seed layer and fills in the elongated openings, forming an interface between a bottom surface of the solder ball pad and a top surface of the underlying dielectric material. Since the seed layer is typically used as an adhesion layer for the solder ball pad, the removal of the seed layer achieves reduced adhesion, allowing the bottom surface of the solder ball pad to move or slide along the top surface of the underlying dielectric material as the solder ball pad expands or contracts at a different rate than the underlying dielectric material.

In both cases, the reduced adhesion allows the solder ball pad to expand and contract at a different rate than the other package materials, such as the underlying dielectric material, in order to prevent damage that may otherwise be caused as the solder ball pad expands or contracts and pulls on or otherwise distorts the package materials, causing damage to the package including the underlying topology of integrated circuits implemented on the die. The teachings provided herein may be applicable to other structures that use thick metal layers, such as a redistributed layer (RDL) pad or a ground plane.

Example Embodiments

Figure 31:
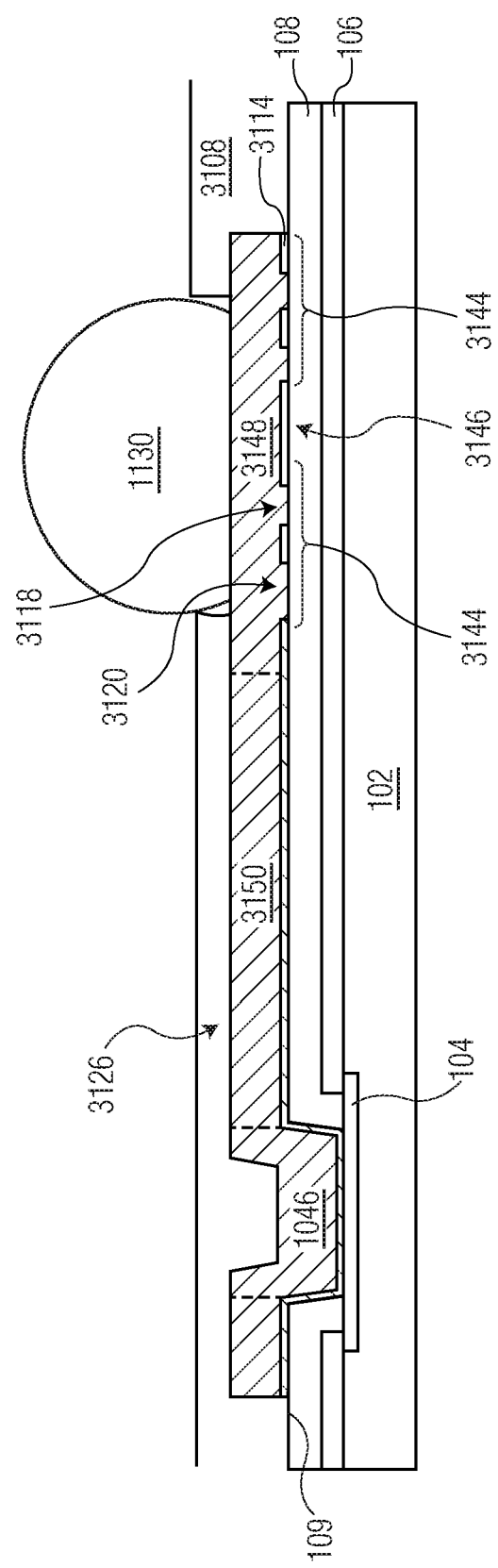
FIGS. 31-34 are diagrams depicting additional embodiments of low stress pad structures in packaged semiconductor devices, according to some embodiments of the present disclosure.
Figure 32:
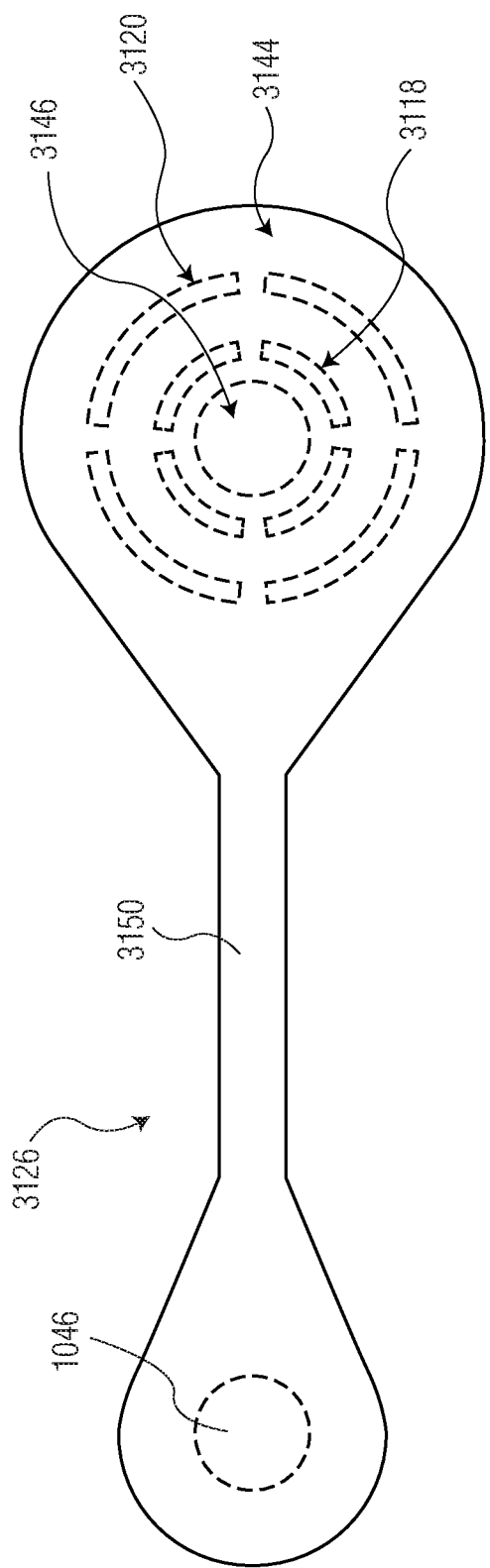
Figure 33:
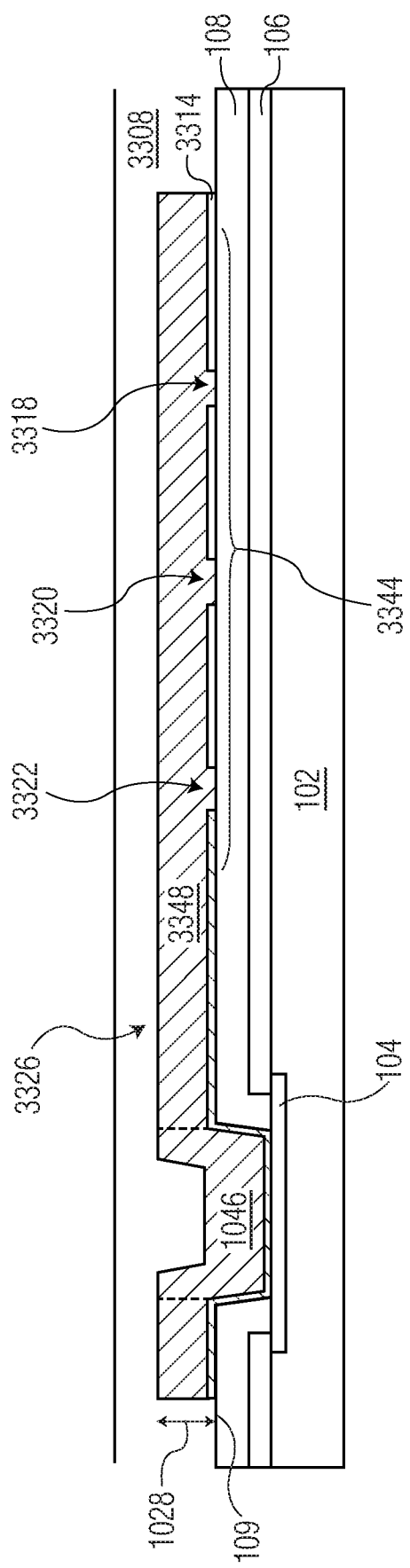
Figure 34:
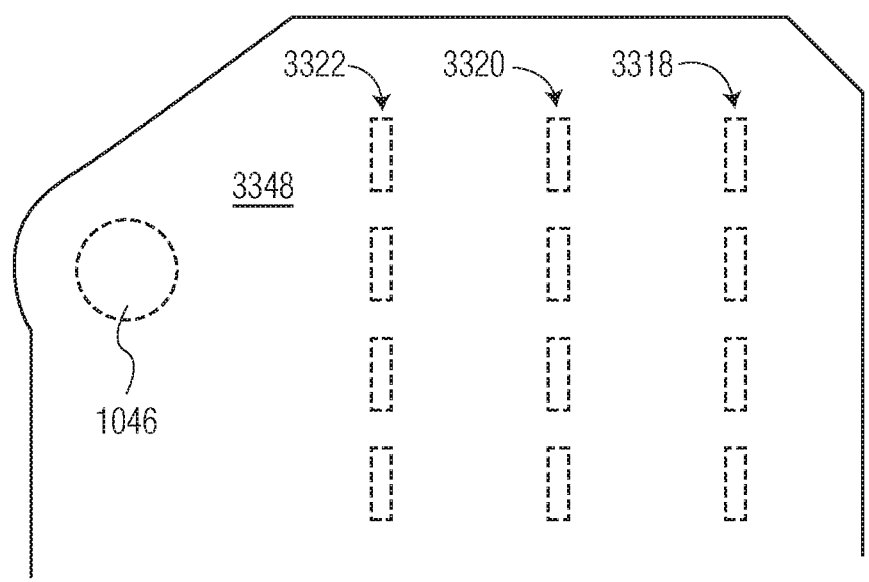

In the following figures, it is noted that the single device structure shown may be representative of a number of device structures formed as part of an array or wafer of device structures that are then singulated into a plurality of packaged devices, where the various steps discussed herein are implemented on all device structures of the array or wafer. While fabrication of a single pad structure is shown in the figures, the fabrication process may form multiple pad structures in parallel across the device structure or across the array or wafer of device structures. For example, low stress pad structures may be formed as modified underbump metallization (UBM) structures directly on a die pad, such as part of a repassivation process, an example of which is shown in FIGS. 1A-11. As another example, low stress pad structures may be formed in a redistributed layer (RDL) structure as modified RDL pads using an RDL process, where the low stress pad structure is formed at the end of a thick copper runner, away from the die pad, an example of which is shown in FIGS. 31-32. The teachings of the low stress pad structure may also be applied in other structures formed in an RDL structure, such as when using a thick copper layer to form plane structures, an example of which is shown in FIGS. 33-34. These teachings may be combined in various ways. Either a repassivation process or an RDL process may be used to achieve the desired low stress pad structure, as further described below.

In some embodiments shown, the resulting low stress pad structure is formed as part of a chip scale packaging (CSP) process to fabricate a CSP package. CSP packages generally have a package footprint equal to or less than 1.2 times the die footprint, but may be larger in other embodiments. CSP packages may also generally have a pitch equal or less than 0.8 mm. While the following figures herein may describe a wafer level CSP (WLCSP) package, the teachings of the present disclosure may also be applicable to other package types, such as a fan out wafer level packaging (FOWLP) package, a ball grid array (BGA) package, or substrates that include a number conductive structures including thick copper pads or solder ball pads formed on dielectric material, or other package types that are configured to have solder ball pads that would benefit from reduced stress.

Figure 9:
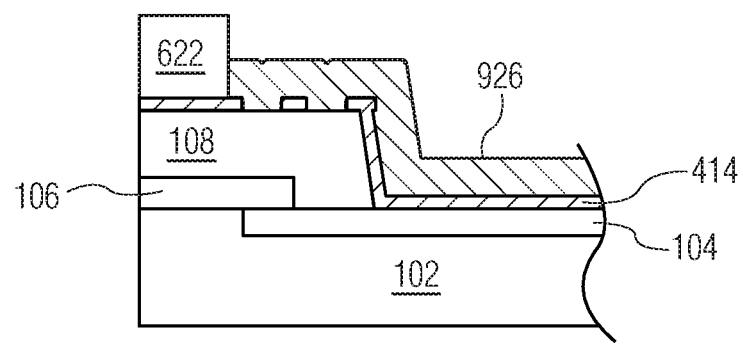
Figure 10:
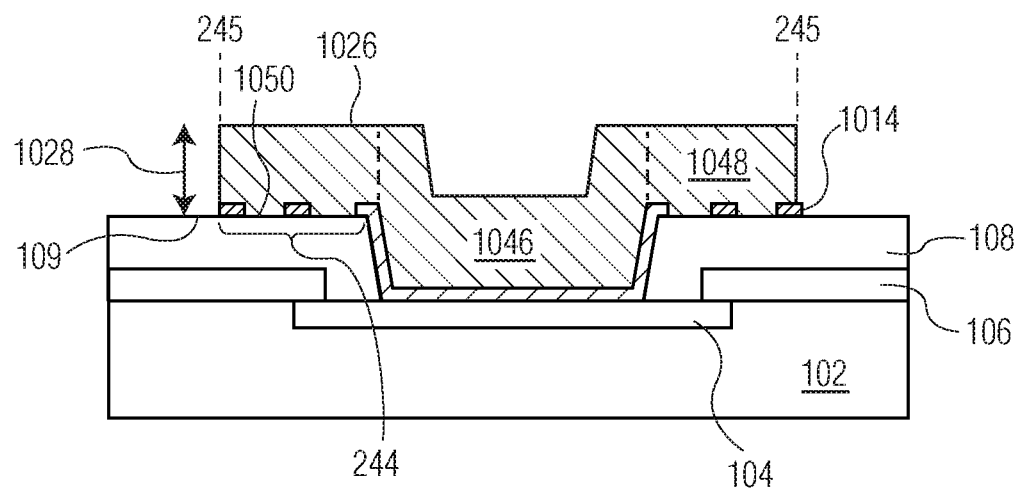
Figure 11:
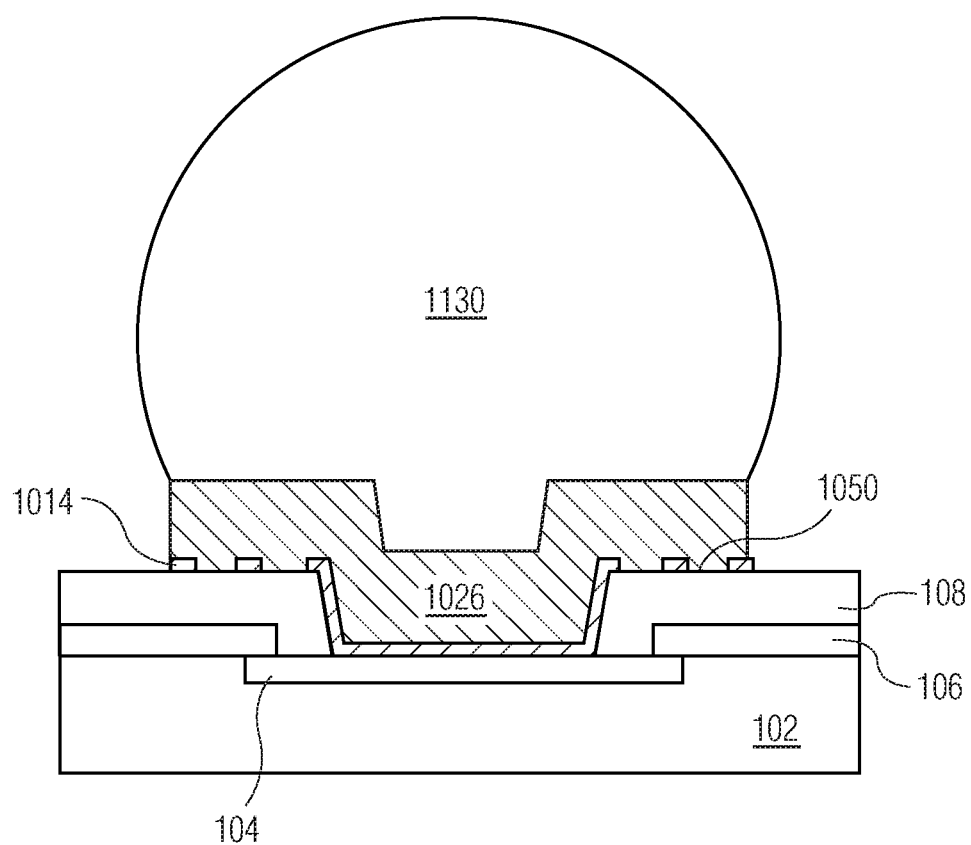

FIGS. 1A-11 show various steps of an example process performed on a device structure to fabricate a low stress pad structure for solder ball attachment like that shown in FIG. 11, where the device structure and low stress pad structure (also referred to as a solder ball pad) may be part of a packaged semiconductor device. The A-series of FIGS. 1A-8A and FIGS. 9-11 show cross-sectional views of the device structure, while the B-series of FIGS. 1B-8B show top-down views of the device structure.

Figure 1B:
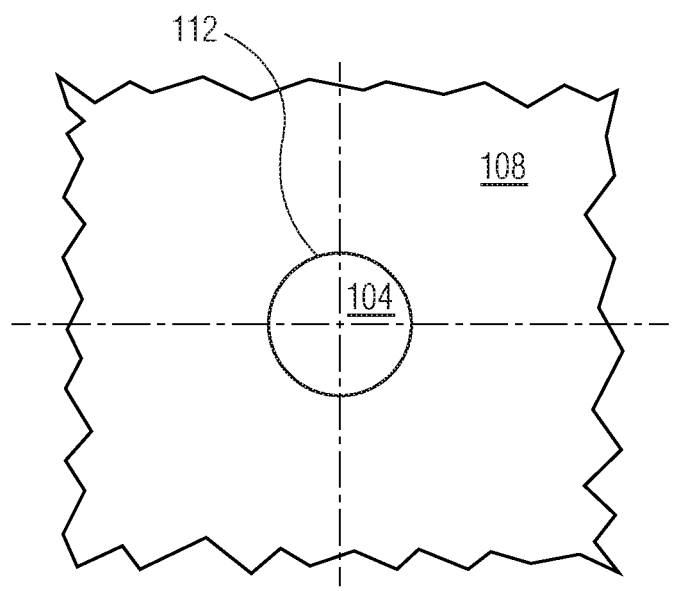

FIG. 1A shows a device structure that includes a semiconductor die 102 (also referred to as die 102), which includes a region in which a low stress pad structure will be formed, which is also referred to herein as a low stress solder ball pad or simply as a solder ball pad. FIG. 1B shows a corresponding top-down view of the region in which the low stress solder ball pad will be formed. As noted above, die 102 may be representative of a substrate made of a semiconductor material, such as a semiconductor wafer or an array of dies (e.g., a reconstituted wafer or panel of dies laterally surrounded by mold compound).

Die 102 has an active side 103 that includes active circuitry and a plurality of bond pads 104. Active circuitry is formed on a substrate of semiconductor material (e.g., die 102) using a plurality of process steps, where the remaining semiconductor material behind or underneath the active circuitry is generally referred to as bulk silicon. The bulk silicon forms a back side of die 102 that is opposite the active side 103. In the embodiment shown, die 102 is in a face-up orientation (e.g., active side 103 of die 102 is facing up). The active circuitry includes interconnects to bond pads 104, which provide contact surfaces for electrical connections. While the portion of die 102 behind or underneath the active circuitry is referred to as bulk silicon, this portion (and the entire semiconductor die 102) can be any semiconductor material or combinations of materials, such as such as gallium arsenide, silicon germanium, silicon-on-insulator (SOI), silicon, monocrystalline silicon, the like, and combinations of the above.

The bond pads 104 may be arranged in various locations on the active side 103 of die 102, such as in one or more rows or other arrangements. Each bond pad 104 may be electrically connected to conductive features of the active circuitry, such as interconnects, vias, traces, and the like. The active side 103 of die 102 may also be covered by a passivation layer 106, which is formed from a dielectric material. Each bond pad 104 is exposed through the passivation layer 106. Examples of materials used for passivation layer 106 include but are not limited to silicon nitride, silicon dioxide, silicon oxynitride, polyimide, and other suitable dielectric materials. The exposed surfaces of pads 104 on die 102 may also be coated with an electrically conductive material, examples of which include nickel, gold, copper, aluminum, tin, silver, titanium, or other suitable conductive metal or alloy composed of one or more suitable conductive metals in order to improve the "bondable" nature of the pad.

In some embodiments, a plurality of low stress pad structures may be formed on the die 102. A number of build-up layers may be formed over the die 102 to achieve the low stress pad structures, where the build-up layers include one or more conductive layers and one or more dielectric layers, where the conductive layers form various conductive features (such as interconnects, vias, traces, and the like) and the dielectric layers insulate the conductive features. In some embodiments, dielectric build-up layers may also include a passivation layer and one or more repassivation layers. In some embodiments, the build-up layers may be formed on the die 102 using a repassivation process. In other embodiments, the build-up layers may be formed on the die 102 using a redistributed layer (RDL) process that forms an RDL structure that includes the low stress pad structures. In some embodiments, low stress pad structures may be formed directly on die pads 104 of the die 102, like that shown in FIG. 10. In other embodiments, low stress pad structures may be formed as an RDL pad that is located away from, and electrically connected to, die pads 104 on die 102, like that shown in FIG. 31.

In some embodiments, the build-up layers may be formed over each die 102 implemented in a wafer of dies or implemented as a panel of dies embedded in mold compound or other suitable material, where the wafer or panel is singulated into a plurality of devices. The build-up layers may be formed using a sequence of numerous process steps applied to the semiconductor die 102, to a wafer of die 102, or to a panel of embedded die 102. Such process steps include but are not limited to depositing semiconductor materials including dielectric materials and metals, such as growing, oxidizing, sputtering, and conformal depositing, etching semiconductor materials, such as using a wet etchant or a dry etchant, performing photolithography for patterning, including depositing and removing photolithography masks or other photoresist materials, laminating, dispensing, printing, jetting, spraying, and the like. Examples of materials used for dielectric build-up layers include but are not limited to polybenzoxazole (PBO), benzocyclobutene (BCB), polyimide, photo sensitive polyimide, and other suitable polymer dielectric materials. Examples of materials used for conductive build-up layers include but are not limited to nickel, gold, copper, aluminum, titanium or other suitable conductive metal or alloy composed of one or more suitable conductive metals. Conductive build-up layers may be applied in the form of a paste in some embodiments.

Figure 2A:
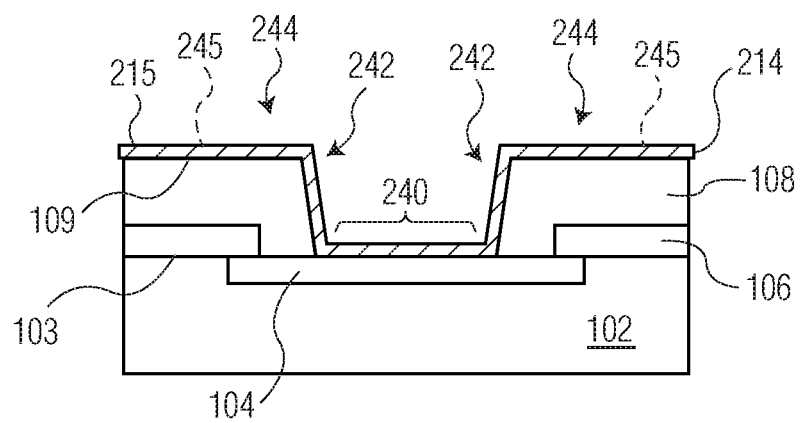

FIG. 1A shows the device structure after a first dielectric build-up layer 108 (also referred to as dielectric layer 108) is formed over the active side 103 of the die 102, where dielectric layer 108 is conformally deposited over and directly contacts passivation layer 106. In some embodiments, dielectric layer 108 may be a repassivation layer formed from a polymer dielectric material, examples of which include but are not limited to polybenzoxazole (PBO), benzocyclobutene (BCB), polyimide, photo sensitive polyimide, and other suitable polymer dielectric materials. In other embodiments, dielectric layer 108 may be one of a number of build-up layers as part of the RDL structure formed on the active side 130 of the die 102. Dielectric layer 108 is patterned to form a plurality of openings 110 through dielectric layer 108 that are smaller in diameter than the openings in passivation layer 106, where each opening 110 exposes a surface of a respective bond pad 104. Each opening 110 has a perimeter 112 formed at the top surface of dielectric layer 108, which also indicates a top edge of sidewalls of the opening 110 that extend down to the bond pad 104. The sidewalls of opening 110 are shown at a slight angle to ensure conformal coverage of a seed layer on the sidewalls, as shown in FIG. 2A. FIG. 1B also shows a surface of bond pad 104 exposed through dielectric layer 108, where perimeter 112 has a circular shape. Perimeter 112 is shown in the remaining B-series top-down views as a reference point for the opening 110 as additional layers are formed over and within opening 110, including over sidewalls of the opening 110.

Figure 2B:
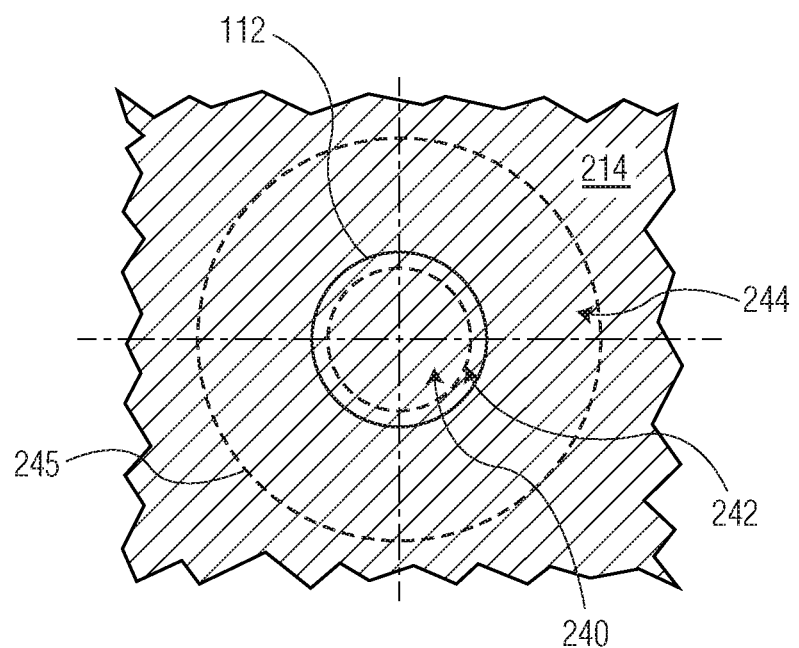

FIG. 2A shows the device structure after a seed layer 214 is formed over the active side 103 of the die 102, where seed layer 214 includes a first region or section 240 that directly contacts the surface of bond pad 104 exposed through dielectric layer 108 (where the bond pad surface may also include a coating of one or more electrically conductive materials, in some embodiments), a second region or section 242 that directly contacts sidewall surfaces of opening 110, and a third region or section 244 that directly contacts a top surface 109 of dielectric layer 108. Seed layer 214 may be formed from one or more conductive metal layers including but not limited to titanium (Ti), titanium tungsten (TiW), copper, or other suitable conductive material at a uniform thickness (e.g., measured between top surface 109 of dielectric layer 108 and a top surface 215 of the seed layer 214). For example, Ti or TiW may be used for adhesion to dielectric layer 108 (e.g., as a bottom or first layer of seed layer 214) and copper may be used for plating (e.g., as a top or second layer of seed layer 214). An example uniform thickness of seed layer 214 (e.g., including both first and second layers) is in the range of 500 angstroms to a few thousand angstroms (e.g., 5000 or 50 to 500 nanometers). FIG. 2B shows additional detail of regions 240, 242, and 244, which are concentric regions. Region 240 is centered within perimeter 112, region 242 is located around region 240 within perimeter 112, and region 244 is located around region 242 outside perimeter 112. While seed layer 214 extends beyond region 244, it is noted that an outer edge 245 of region 244 indicates an anticipated outer edge 245 of the solder ball pad that will be formed. Regions 240 and 242 may together be referred to as a region or section 240+242 within perimeter 112.

Figure 3A:
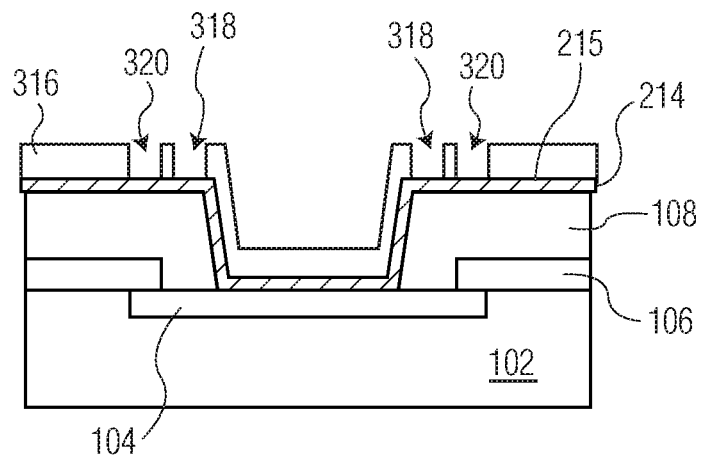

FIG. 3A shows the device structure after a photoresist layer 316 is formed over the active side 103 of the die 102, where the photoresist layer 316 is conformally deposited over and directly contacts seed layer 214, such as by being spun on, laminated, sprayed, printed, or other suitable approach depending on the material properties. Photoresist layer 316 is also patterned to form a plurality of slots through photoresist layer 316 around opening 110 (e.g., outside of perimeter 112), where each slot exposes a portion of top surface 215 of seed layer 214. In the embodiment shown, the plurality of slots include a first set of slots 318 and a second set of slots 320, where the first set of slots 318 are formed at a first distance away from the perimeter 112, and the second set of slots 320 are formed at a second distance away from the perimeter 112, and the second distance is greater than the first distance. In some embodiments, photoresist layer 316 may be formed from photosensitive or light sensitive material, which may be patterned by exposure to light and application of a developer solvent. In other embodiments, photoresist layer 316 may be formed from a material that can be ablated by laser, allowing a laser to be used for patterning the material into a patterned photoresist layer 316. Photoresist layer 316 serves as an etching mask to pattern seed layer 214.

Figure 3B:
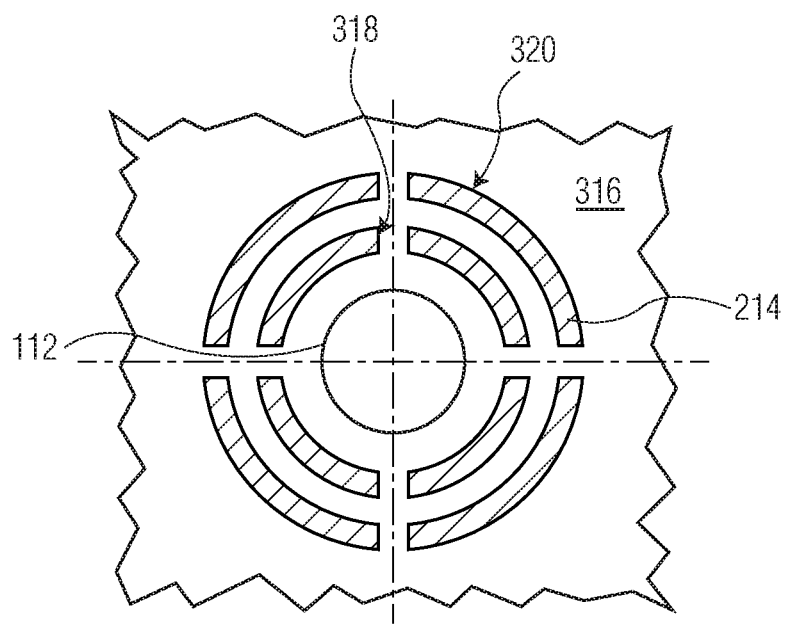

FIG. 3B shows additional detail of slot sets 318 and 320, each of which have an elongated shape. In the embodiment shown, slots 318 and 320 are curved segments that are concentrically arranged around perimeter 112 in a "target" or circular pattern, where the slots 318 and 320 are situated in four quadrants formed by a vertical crossbar and a horizontal crossbar centered on the opening 110 in the photoresist layer 316. Since the seed layer 214 that is exposed through slots 318 and 320 will be removed, the vertical and horizontal crossbars of photoresist layer 316 ensure that an adequate amount of the seed layer 214 remains under the resulting solder ball pad for sufficient mechanical support during plating (further discussed below) and for sufficient adhesion of the resulting solder ball pad to the dielectric layer 108, while also allowing for expansion of the solder ball pad at a different rate than the surrounding materials (e.g., the underlying dielectric layer 108). Slots 318 and 320 may be differently shaped in other embodiments. However, the elongated openings 418 and 420 (further discussed below) that result from the curved-shaped segments may provide the benefit of radially distributing mechanical stress outwards (e.g., due to the underlying dielectric layer 108 having a much larger CTE than the solder ball pad), which may achieve a more uniform stress distribution within the solder ball pad than if elongated openings 418 and 420 had non-curved shapes. Different numbers of slots 318 and 320 may also be implemented in other embodiments, which may also have different shapes (e.g., curved, oval, irregular) in other embodiments.

Figure 4A:
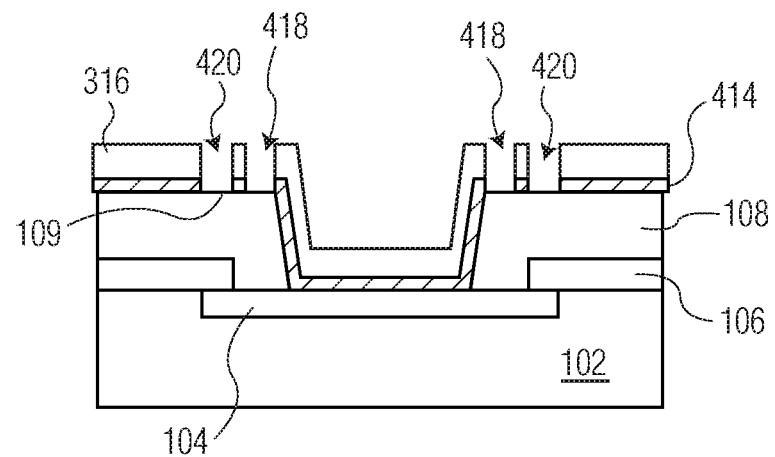
Figure 4B:
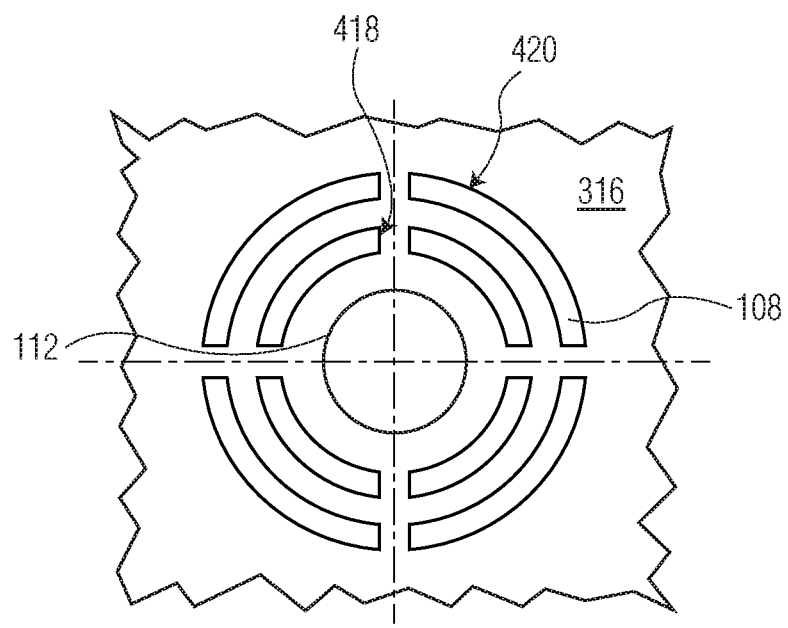

FIG. 4A shows the device structure after an etching step is performed, which removes portions of the seed layer 214 that are exposed through the slots 318 and 320 of photoresist layer 316. The seed layer 214 (e.g., including both the first and second layers) is patterned or etched to form a patterned seed layer 414, which includes elongated openings 418 and 420 that have been etched away in the seed layer 214 respectively through slots 318 and 320. As a result, portions of the top surface 109 of the underlying dielectric layer 108 are exposed through the newly formed elongated openings 418 and 420 and through the slots 318 and 320. The etchant used may be a wet etchant, and more than one etchant may be used, depending on the seed layer structure. For example, if a first layer of TiW (or a titanium tungsten alloy) and a second layer of copper are used to implement the seed layer, ammonium persulfate may be used to etch off the copper, and then hydrogen peroxide may be used to etch off the TiW. FIG. 4B shows additional detail of the elongated openings 418 and 420 through photoresist layer 316, which are concentric around opening 110.

Figure 5A:
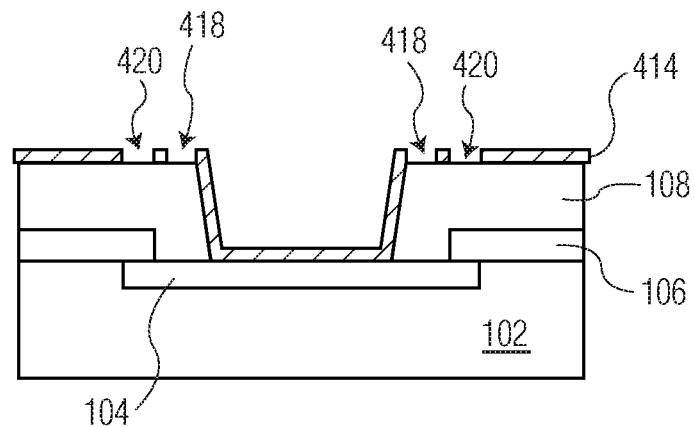
Figure 5B:
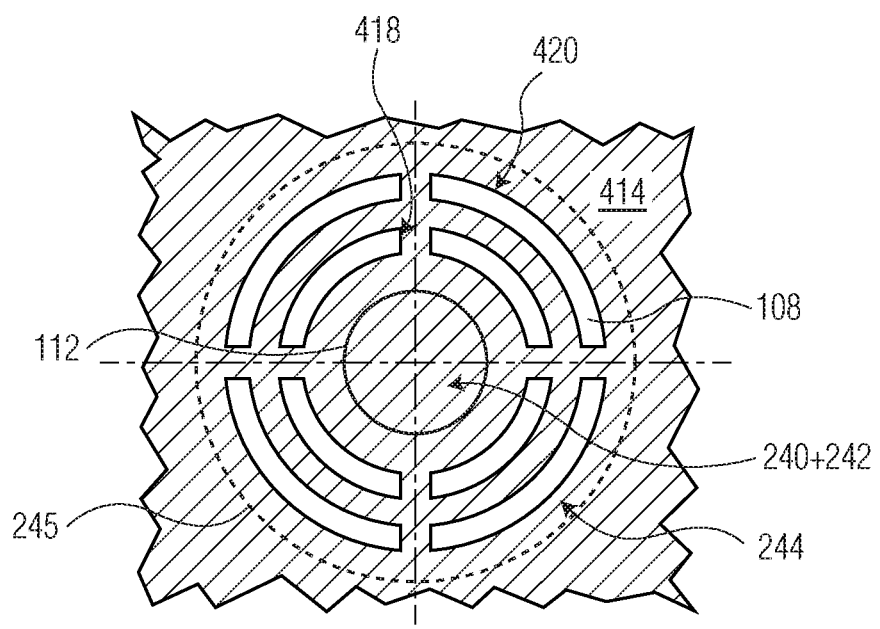

FIG. 5A shows the device structure after the photoresist layer 316 is removed to expose patterned seed layer 414. A stripper may be used to remove photoresist layer, such as a solvent like acetone selectively targeted to the photoresist material that forms the photoresist layer 316. Dry etch (such as plasma ash) or ion implantation may also be used to remove the photoresist layer 316. Patterned seed layer 414 is shown in additional detail in FIG. 5B, which shows openings 418 and 420 formed in patterned seed layer 414, which exposes portions of dielectric layer 108. The outer edge 245 of region 244 is also reproduced to indicate the anticipated outer edge 245 of the solder ball pad that will be formed. The vertical and horizontal crossbars in the seed layer 414 are also shown in FIG. 5B. In the embodiment shown, the portion of seed layer 414 formed within perimeter 112 (also referred to as region 240+242) is connected to the remaining portion of the seed layer 414 outside perimeter 112 on the top surface of the dielectric layer 108 (also referred to as region 244) through the vertical and horizontal crossbars. Put another way, the patterned seed layer 414 is continuous within region 244, where the openings 418 and 420 do not create a separate or divided portion of seed layer 414 that is not connected to the remaining portion of seed layer 414. The continuous portions within region 244 are electrically connected in order to plate copper onto the seed layer 414, as discussed below in connection with FIG. 7A. In other embodiments, the openings 418 and 420 may be formed as different shaped openings, as long as all remaining portions of seed layer 414 are continuous and electrically connected within region 244.

Figure 6A:
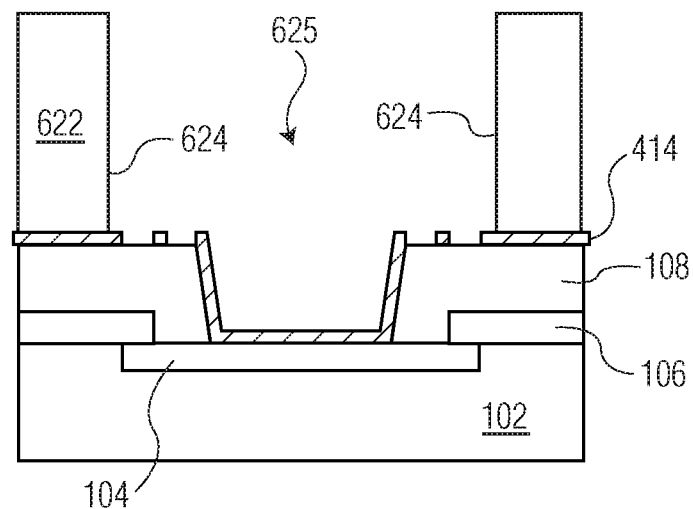
Figure 6B:
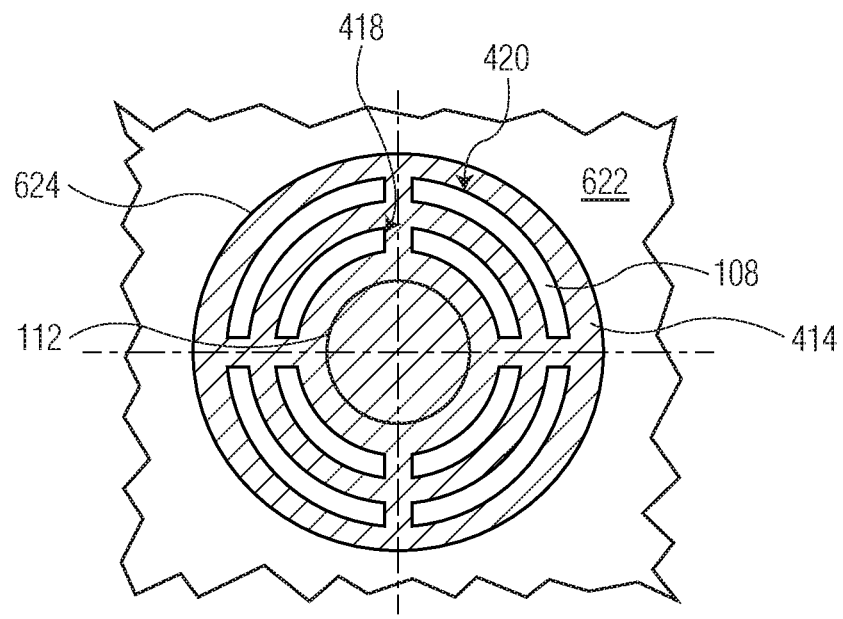

FIG. 6A shows the device structure after a photoresist layer 622 is formed over the active side of die 102, where the photoresist layer 622 is conformally deposited over and directly contacts patterned seed layer 414, such as by being spun on, laminated, sprayed, printed, or other suitable approach depending on the material properties. Photoresist layer 622 is also patterned to form an opening 625 through photoresist layer 622 to expose the area on the device structure in which the solder ball pad will be formed (e.g., regions 240+242 and 244). In some embodiments, photoresist layer 622 may be formed from photosensitive or light sensitive material, which may be patterned by exposure to light and application of a developer solvent. In other embodiments, photoresist layer 622 may be formed from a material that can be ablated by laser, allowing a laser to be used for patterning the material into a patterned photoresist layer 316. FIG. 6B further shows side walls 624 of the opening 625, which are formed along the outer edge 245 of region 244. The opening 625 exposes region 240+242 within perimeter 112 and region 244 outside of perimeter 112, including elongated openings 418 and 420 formed in seed layer 414 in region 244.

Figure 7A:
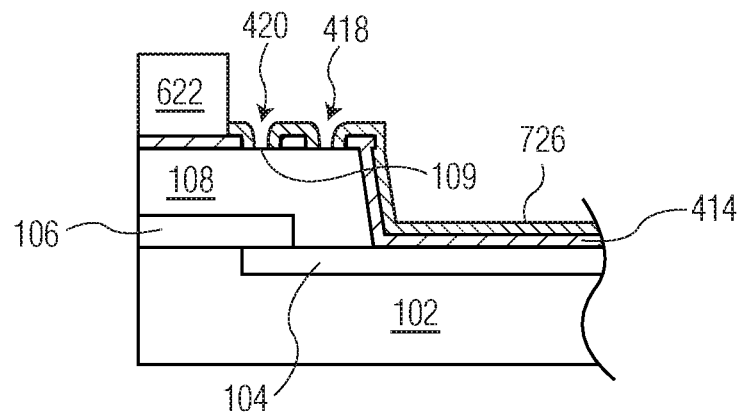
Figure 7B:
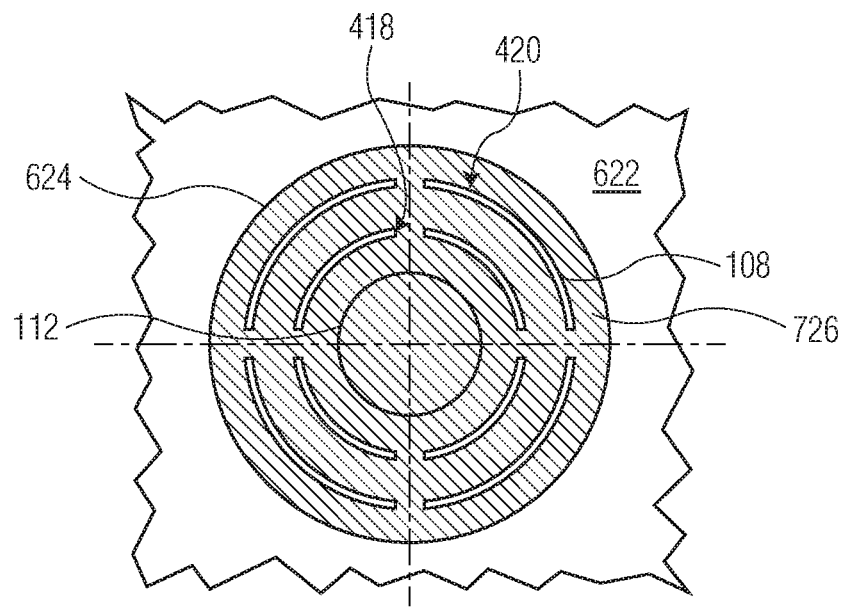

FIG. 7A shows the device structure after a plating step has begun. The plating step is performed over some amount of time to form the solder ball pad within the opening 625, where example progressing points of time in the plating step are shown in FIGS. 7A, 8A, 9, and 10. The plating step may include an electroless plating process that plates a conductive metal, such as copper, onto the seed layer 414 exposed within opening 625. At the time shown in FIG. 7A, the plating step forms a metal layer 726 on seed layer 414, the metal layer 726 having a uniform thickness in both the vertical and lateral directions. Metal layer 726 is formed over the top and lateral surfaces of the exposed portion of the seed layer 414, including within the openings 418 and 420. Example materials used to form metal layer 726 include but are not limited to one or more of copper, nickel, titanium, gold, or other suitable conductive metal or alloy composed of one or more suitable conductive metals, where the metal layer 726 may be formed as a multi-layered stack of different conductive metals in some embodiments. FIG. 7B shows openings 418 and 420 in additional detail, where metal layer 726 has not yet filled in the openings 418 and 420, and the top surface 109 of dielectric layer 108 is still exposed through openings 418 and 420.

Figure 8A:
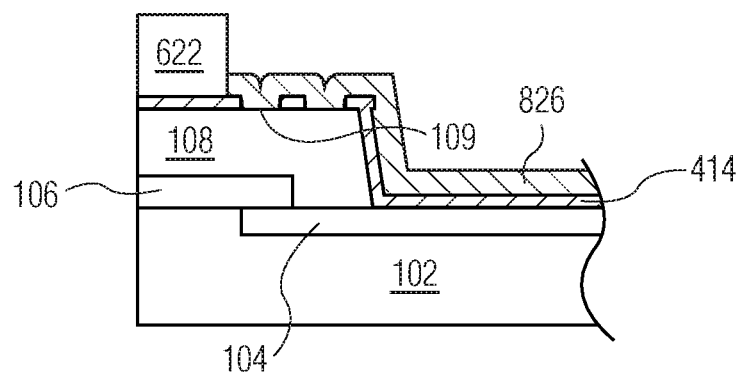
Figure 8B:
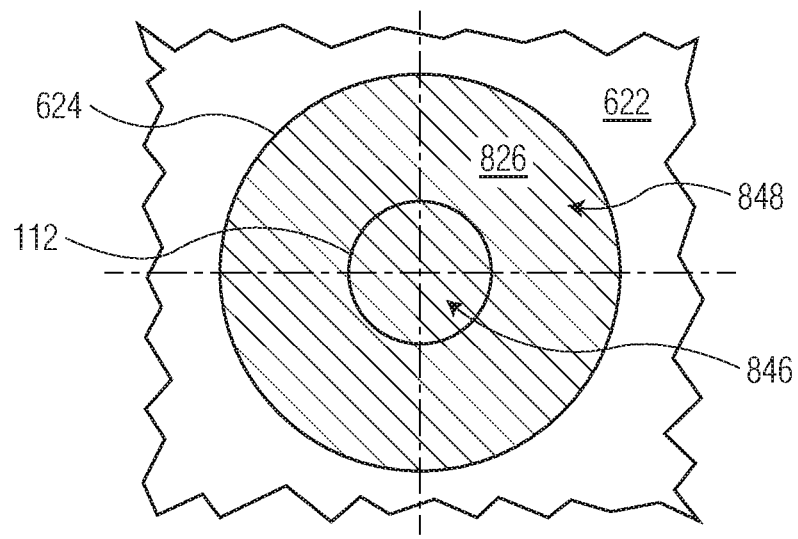

FIG. 8A shows the device structure at a subsequent point in time in the plating step where the plating has expanded metal layer 726 to metal layer 826 having a uniform thickness in both the vertical and lateral directions. FIG. 8B shows the area within opening 625 in additional detail, where metal layer 826 is (laterally) thick enough to have filled in the openings 418 and 420 in seed layer 414, and the top surface 109 of dielectric layer 108 is no longer exposed through openings 418 and 420. Metal layer 826 includes region 846 formed within perimeter 112 (also referred to as plating formed on regions 240 and 242 of seed layer 414 within opening 110) and region 848 formed outside of perimeter 112 (also referred to as plating formed on region 244 of seed layer 414 outside of opening 110).

FIG. 9 shows the device structure at a further subsequent point in time in the plating step where the plating has expanded metal layer 826 to metal layer 926. Since the openings 418 and 420 have been filled in, metal layer 926 continues to expand in the vertical direction with some uniform thickness. FIG. 9 has a top-down view similar to that shown in FIG. 8B.

FIG. 10 shows the device structure once the plating step is complete, which is when the metal layer 926 expands to a final thickness 1028, forming solder ball pad 1026. The solder ball pad 1026 includes an inner region or section 1046 formed within perimeter 112 (or within opening 110) and an outer region or section 1048 formed outside perimeter 112 (or opening 110). In some embodiments, thickness 1028 is greater than 10 microns, where the solder ball pad may also be described as a "thick" solder ball pad. In the embodiment shown, region 1048 forms a ring-shaped portion around opening 110 over the dielectric layer 108. FIG. 10 also shows the device structure after the photoresist layer 622 is removed and any portion of the seed layer 414 outside of outer region 1048 (or outside the outer edge 245 of solder ball pad 1026) is also removed, leaving a remaining seed layer portion 1014 under the solder ball pad 1026 that includes seed layer region 244 formed outside perimeter 112 under outer region 1048, as discussed above.

As a result, region 244 forms a ring-shaped portion around opening 110, once the rest of seed layer 414 is removed outside of outer region 1048. In embodiments where openings 418 and 420 are formed as complete circle-shaped openings, a second ring in the remaining seed layer portion 1014 would be formed outside of the first ring after removal of the seed layer outside of the outer edge of region 244. In some embodiments, a top surface of solder ball pad 1026 may be treated or coated with one or more conductive materials, examples of which include but are not limited to nickel, gold, copper, titanium, tungsten, chromium, palladium, or other suitable conductive metal or alloy composed of one or more suitable conductive metals. Such conductive metals improve wettability and proper adhesion of solder balls to the solder ball pad 1026.

A bottom surface 1050 of outer region 1048 contacts a portion of top surface 109 of the underlying dielectric layer 108, within the elongated openings 418 and 420 in seed layer portion 1014. Since the seed layer portion 1014 acts as an adhesion layer for the solder ball pad 1026, adhesion is reduced within the elongated openings 418 and 420, allowing the solder ball pad 1026 to expand or contract at a different rate than the underlying dielectric layer 108. For example, as the solder ball pad 1026 expands or contracts, the bottom surface 1050 of solder ball pad 1026 may "move" or slide in a lateral (or radial) direction along surface 109 of dielectric layer 108. The stresses introduced into the dielectric layer 108 by solder ball pad's expansion or contraction are greatly reduced due to the reduced adhesion at the interface of surface 1050 and surface 109, which reduces the risk of damaging dielectric layer 108. If the solder ball pad 1026 were more strongly adhered to the dielectric layer 108, the expansion and contraction of solder ball pad 1026 may introduce stress or tension into the dielectric layer 108, which may cause damage to the dielectric layer 108 (and any underlying integrated circuit layers) by the solder ball pad 1026 pulling or even breaking the dielectric layer 108.

FIG. 11 shows the device structure after ball drop is performed. A solder ball 1130 is dropped onto solder ball pad 1026, where a reflow process may be performed to bond solder ball 1130 to the surface of solder ball pad 1026 (where the surface may also include a coating of one or more electrically conductive materials, in some embodiments), electrically connecting solder ball 1130 to the underlying bond pad 104, which in turn may be electrically connected to a respective signal line of the die 102. Solder ball 1130 may be a solder bump in other embodiments or other suitably shaped joint. Solder ball 1130 is formed from a tin or a tin alloy. In embodiments where the device structure is part of a panel or array of device structures, device singulation is performed after ball drop, producing a plurality of device structures.

Figure 17:
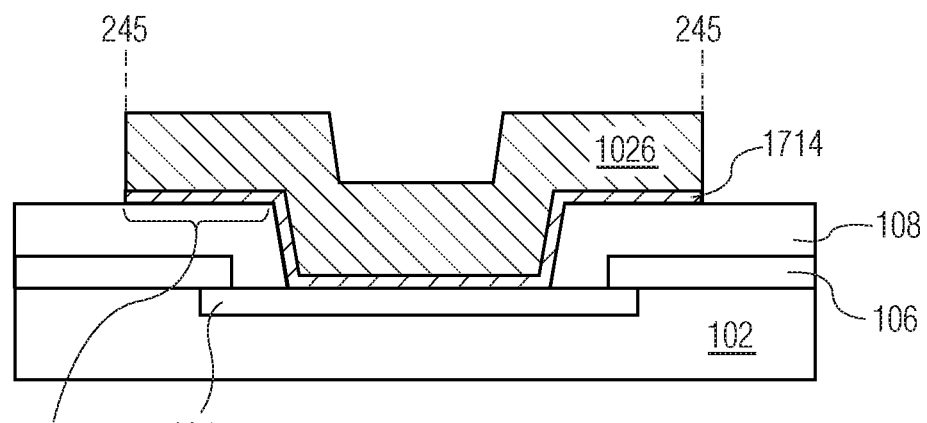
Figure 18:
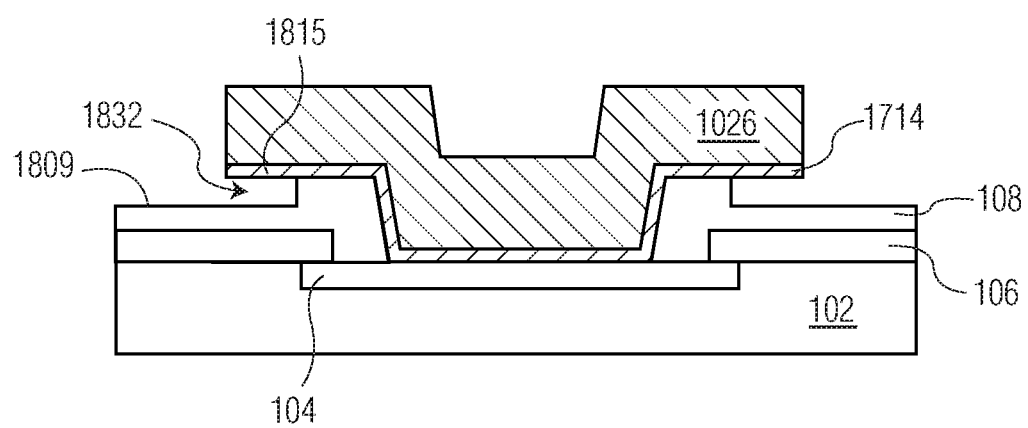
Figure 19:
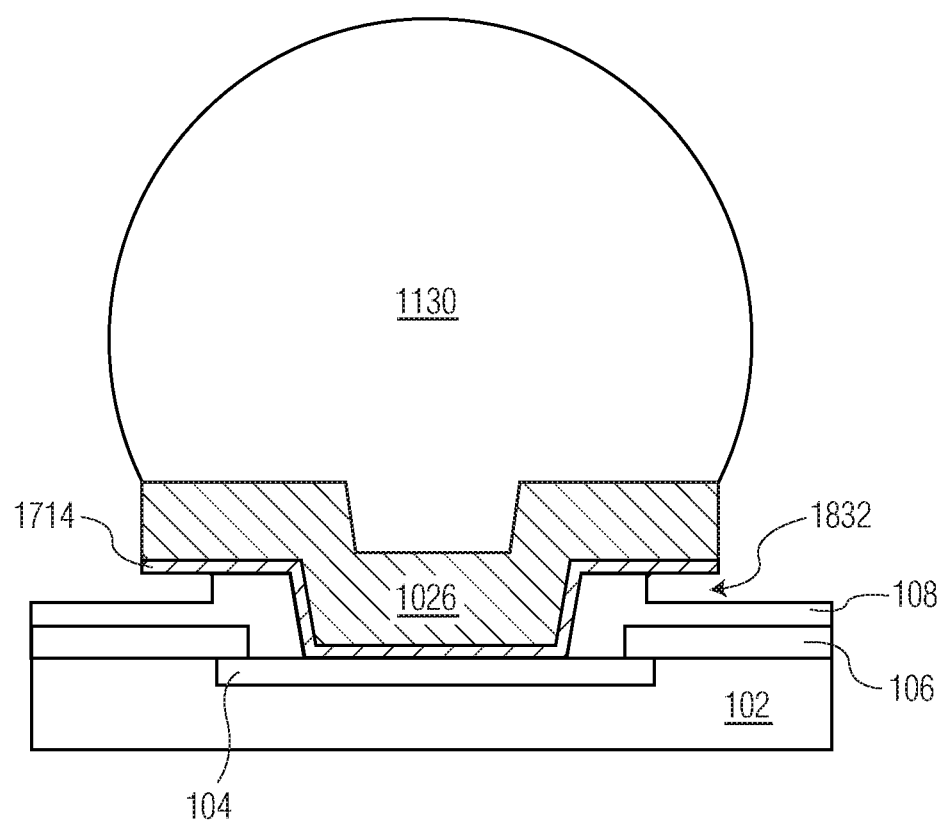

FIGS. 12-19 show various steps of another example process performed on a device structure to fabricate a low stress pad structure for solder ball attachment like that shown in FIG. 19, where the device structure and low stress pad structure (also referred to as solder ball pad herein) may be part of a packaged semiconductor device. FIGS. 12-19 show cross-sectional views of the device structure, where top-down views are may be similar to those shown in FIGS. 1A-11, as noted below.

Figure 12:
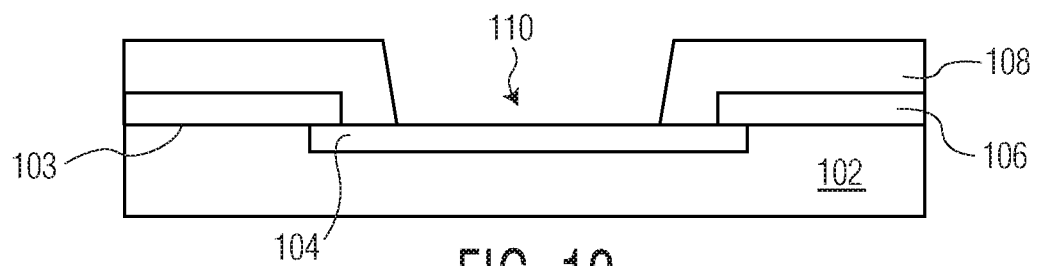
FIGS. 12-19 are diagrams depicting another example fabrication process for implementing low stress pad structures for a packaged semiconductor device, according to some embodiments of the present disclosure.
Figure 13:
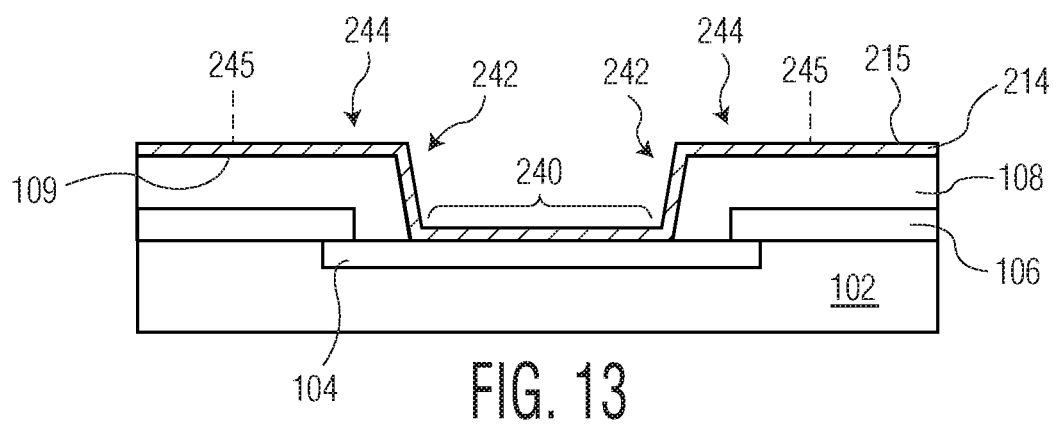
Figure 14:
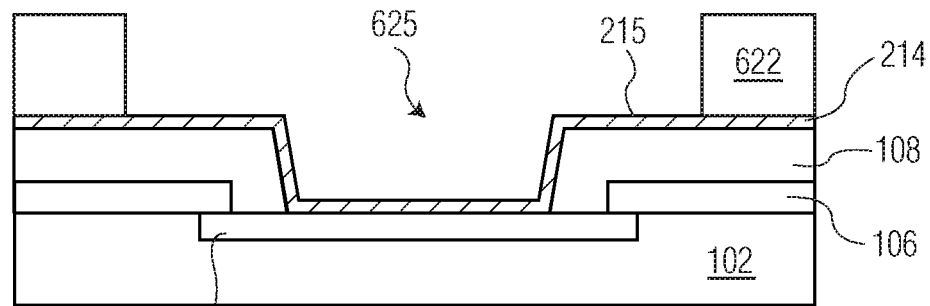

FIG. 12 shows the device structure after a first dielectric build-up layer 108 is formed over the active side 103 of die 102, with an opening 110 formed to expose a surface of bond pad 104, similar to that described above in connection with FIG. 1A. FIG. 13 shows the device structure after a seed layer 214 is formed over the active side 103 of the die 102, where the seed layer 214 includes a first region 240 that directly contacts bond pad 104, a second region 242 that directly contacts sidewall surfaces of opening 110, and a third region 244 that directly contacts a top surface 109 of dielectric layer 108 and has an outer edge 245, similar to that described above in connection with FIG. 2A. FIG. 14 shows the device structure after a photoresist layer 622 is formed over the active side 103 of die 102, with an opening 625 formed having side walls that align with the outer edge 245 of region 244 to expose an area of seed layer 214 on which the solder ball pad will be formed, similar to that described above in connection with FIG. 6A.

Figure 15:
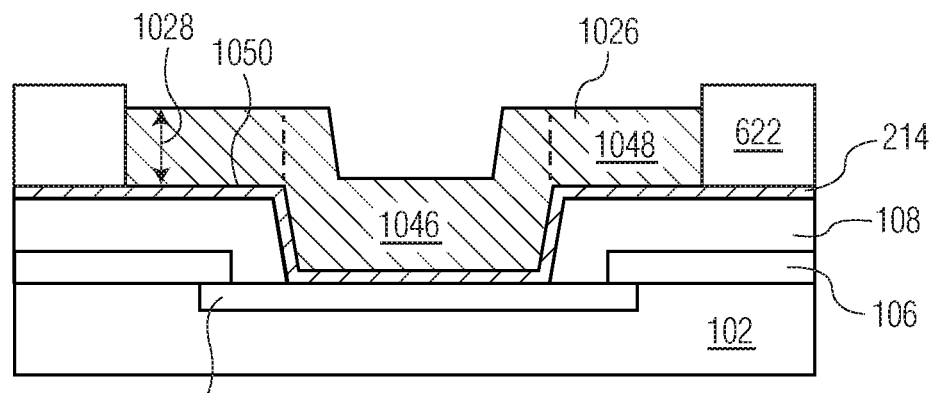
Figure 16:
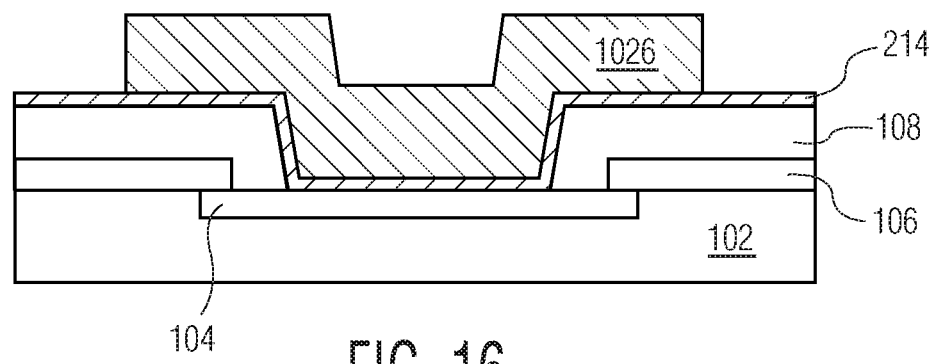

FIG. 15 shows the device structure after a plating step is performed, forming solder ball pad 1026 to a desired thickness 1028 within opening 625 on seed layer 214, where solder ball pad 1026 includes an inner region 1046 formed within opening 110 and an outer region 1048 formed outside of opening 110, similar to that described above in connection with FIG. 10. The bottom surface 1050 of outer region 1048 contacts top surface 109 of the underlying dielectric layer 108. FIG. 16 shows the device structure after the photoresist layer 622 is removed, similar to that described above in connection with FIG. 10. FIG. 17 shows the device structure after any portion of seed layer 214 outside of outer region 1048 (or outside of outer edge 245 of solder ball pad 1026) is removed, leaving a remaining seed layer portion 1714 under the solder ball pad 1026 that includes region 244 under outer region 1048, also similar to that described above in connection with FIG. 10.

FIG. 18 shows the device structure after an etching step is performed on the dielectric layer 108. The etching step removes a top portion of the dielectric layer 108, revealing a new top surface 1809. The etching step of FIG. 18 uses an etchant that etches under and around the solder ball pad 1026, forming a lateral opening 1832 under the outer edge of solder ball pad 1026. The lateral opening 1832 extends under a portion of outer region 1048 by some distance. In the embodiment shown, the etchant may be chlorine, bromine, oxygen, argon, nitrogen, or other suitable agent, depending on the dielectric material being removed. The general size of the lateral opening 1832 is dependent on the chemical concentration of the etchant used, the temperature, and the exposure time. In some embodiments, a temporary etching mask may be applied to the device structure if a comprehensive or complex etch pattern is required to achieve lateral opening 1832, where the temporary etching mask is removed after lateral opening 1832 is formed. In some embodiments, multiple etching techniques may need to be applied to achieve a desired profile, such as by combining the etching with ionic species (e.g., that etches in a vertical direction) and radical species (e.g., that etches in a radial direction, providing an undercut under edges of the etching mask).

Generally, the lateral opening 1832 separates the outer region 1048 of solder ball pad 1026 from the underlying dielectric material 108. In some embodiments, lateral opening 1832 exposes a bottom surface 1815 of a portion of seed layer portion 1714 in region 244 that underlies outer region 1048 of solder ball pad 1026, releasing the outer region 1048 from the underlying dielectric material. In other embodiments, lateral opening 1832 may not completely remove dielectric material 108 to expose bottom surface 1815. The lateral opening 1832 may have some height in the range of a few microns, depending on the stresses needed to be released. Since the seed layer portion 1714 acts as an adhesion layer for the solder ball pad 1026, adhesion is reduced by lateral opening 1832, allowing the solder ball pad 1026 to expand or contract at a different rate than the underlying dielectric layer 108. For example, as the solder ball pad 1026 expands or contracts, the outer region 1048 of solder ball pad 1026 may move in a lateral (or radial) direction. However, since that portion of solder ball pad 1026 is released from dielectric layer 108 (e.g., achieves zero adhesion), the stresses introduced into the dielectric layer 108 by solder ball pad's expansion or contraction are greatly reduced due to the reduced adhesion around the outer region 1048 of solder ball pad 1026, which reduces the risk of damaging dielectric layer 108. FIG. 19 then shows the device structure after ball drop is performed, where solder ball 1130 is dropped onto solder ball pad 1026, similar to that described above in connection with FIG. 11. In other embodiments, the etching step to release outer portion 1048 from the underlying dielectric material may be performed after ball drop.

Figure 25:
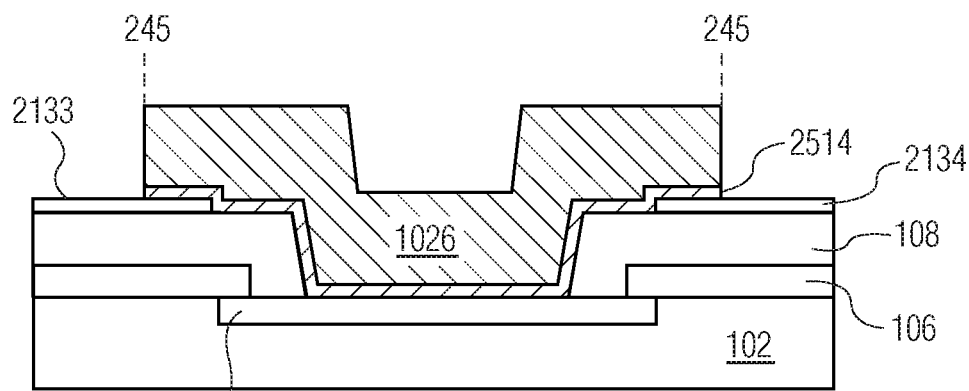
Figure 26:
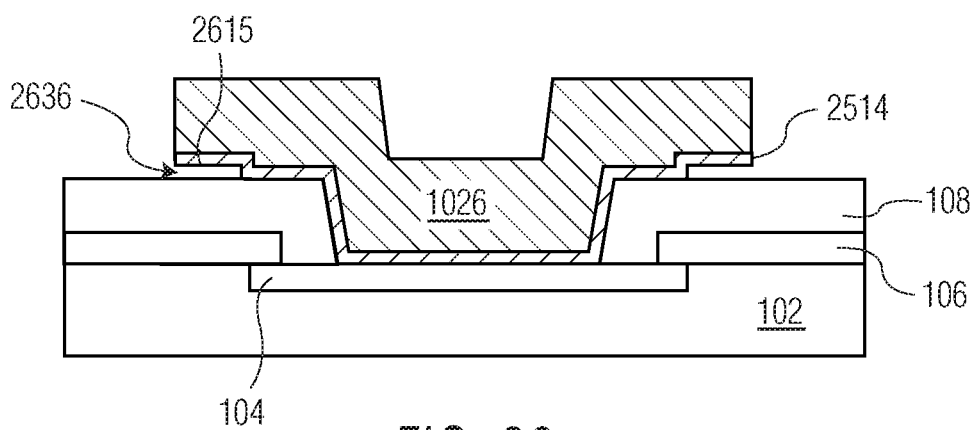
Figure 27:
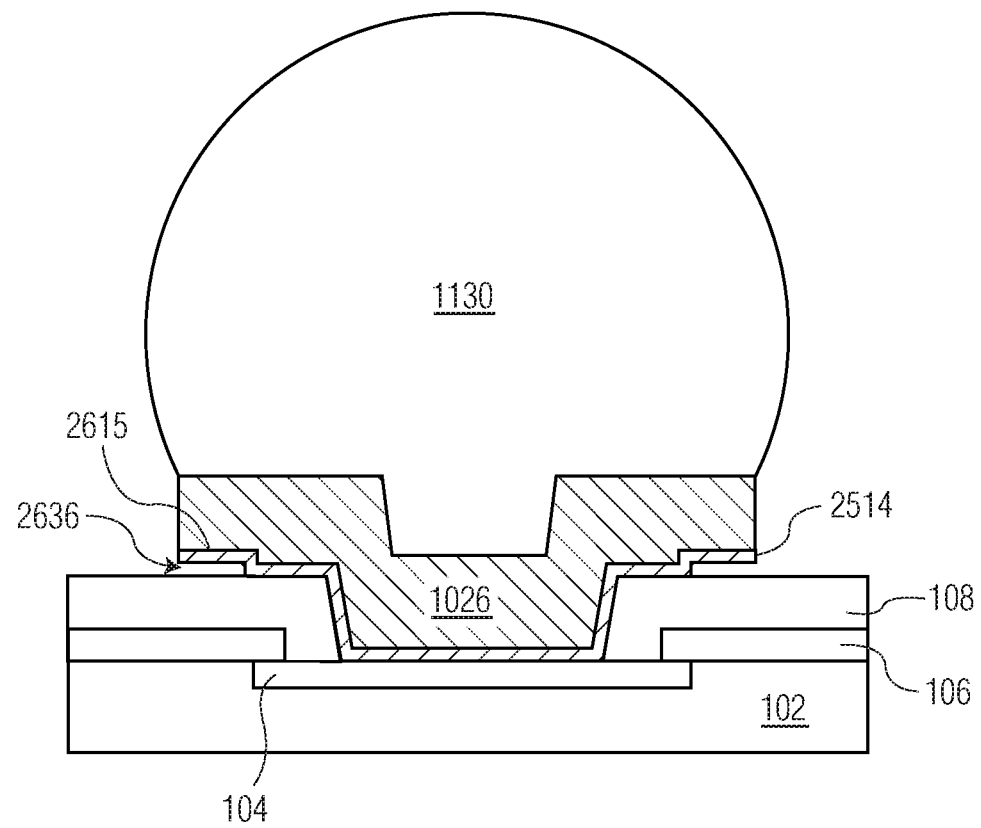

FIGS. 20-27 show various steps of yet another example process performed on a device structure to fabricate a low stress pad structure for solder ball attachment like that shown in FIG. 27, where the device structure and low stress pad structure (also referred to as solder ball pad herein) may be part of a packaged semiconductor device. FIGS. 20-27 show cross-sectional views of the device structure.

Figure 20:
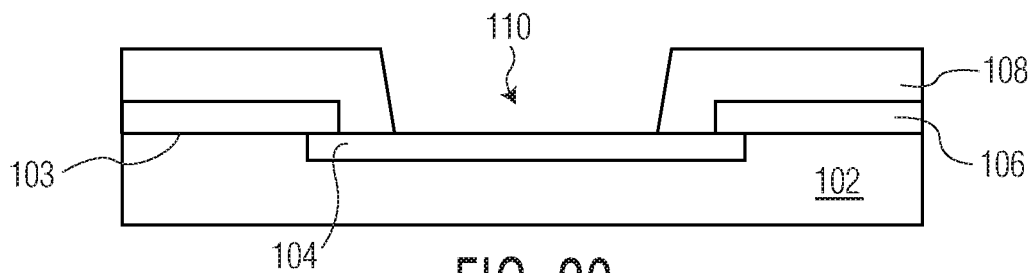
FIGS. 20-27 are diagrams depicting yet another example fabrication process for implementing low stress pad structures for a packaged semiconductor device, according to some embodiments of the present disclosure.
Figure 21:
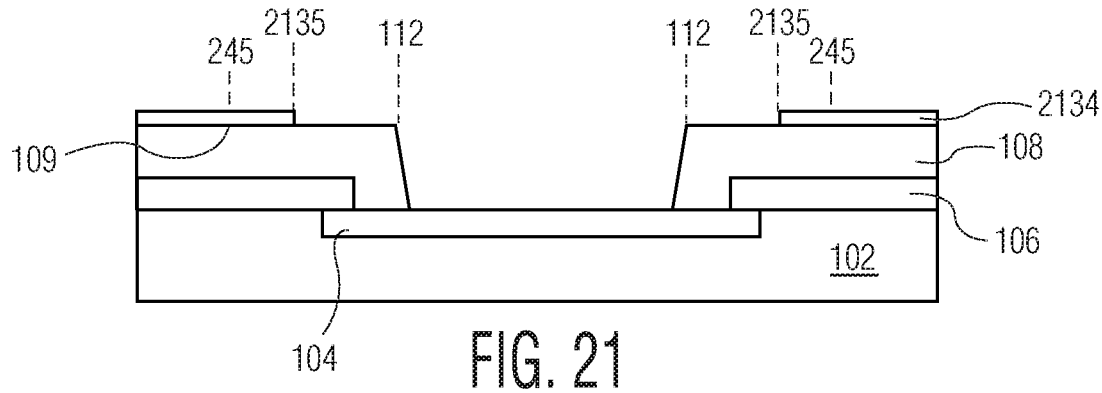

FIG. 20 shows the device structure after a first dielectric build-up layer 108 is formed over the active side 103 of die 102, with an opening 110 formed to expose a surface of bond pad 104, similar to that described above in connection with FIG. 1A. FIG. 21 shows the device structure after a sacrificial layer 2134 is formed over the active side 103 of the die 102, where the sacrificial layer 2134 directly contacts the surface 109 of dielectric layer 108 around opening 110. The sacrificial layer 2134 is patterned to surround opening 110 (e.g., an edge 2135 of sacrificial layer 2134 is laterally separated from perimeter 112 by some distance), where edge 2135 of the sacrificial layer 2134 overlaps the anticipated outer edge 245 of the solder ball pad (and the outer edge 245 of region 244). Sacrificial layer 2134 has a thickness that is large enough to achieve successful subsequent removal of the sacrificial layer 2134, but not thick enough that negatively impacts the final package standoff and profile. For example, thickness of sacrificial layer 2134 may fall in arrange of 1 to 5 microns. In the embodiment shown, sacrificial layer 2134 is light sensitive and is patterned similar to a photoresist layer. Sacrificial layer 2134 may be formed from a sacrificial dielectric material that is removable, examples of which include but are not limited to removable materials based on polyalkylene carbonates, norbornene polymers or monomers, heat-sensitive polymers, water-soluble polymers, ultraviolet (UV) light sensitive polymers, and the like.

Figure 22:
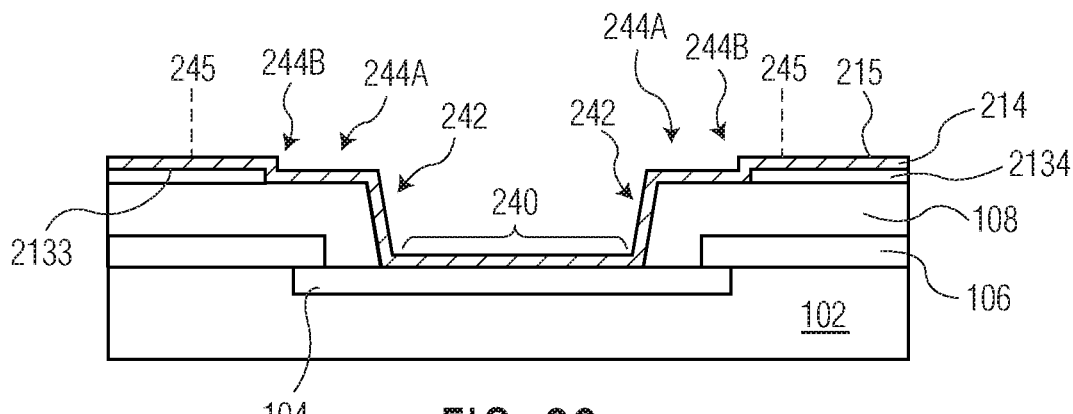
Figure 23:
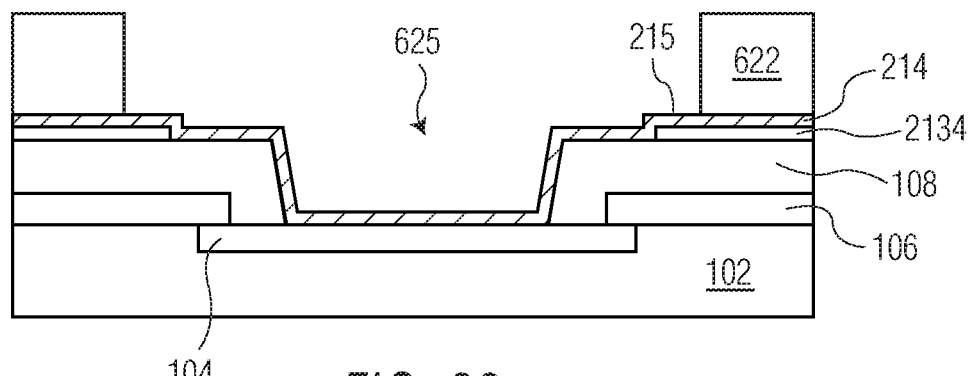

FIG. 22 shows the device structure after a seed layer 214 is formed over the active side 103 of die 102, where the seed layer 214 includes a first region 240 that directly contacts bond pad 104 and a second region 242 that directly contacts sidewall surfaces of opening 110, similar to that described above in connection with FIG. 2A. In the embodiment shown in FIG. 22, seed layer 214 also includes a third region 244 that has an inner section 244A that directly contacts a top surface 109 of dielectric layer 108 and an outer section 244B that directly contacts a top surface 2133 of sacrificial layer 2134. FIG. 23 shows the device structure after a photoresist layer 622 is formed over the active side 103 of die 102, with an opening 625 formed having side walls that align with the outer edge 245 of region 244 to expose an area of seed layer 214 on which the solder ball pad will be formed, similar to that described above in connection with FIG. 6A.

Figure 24:
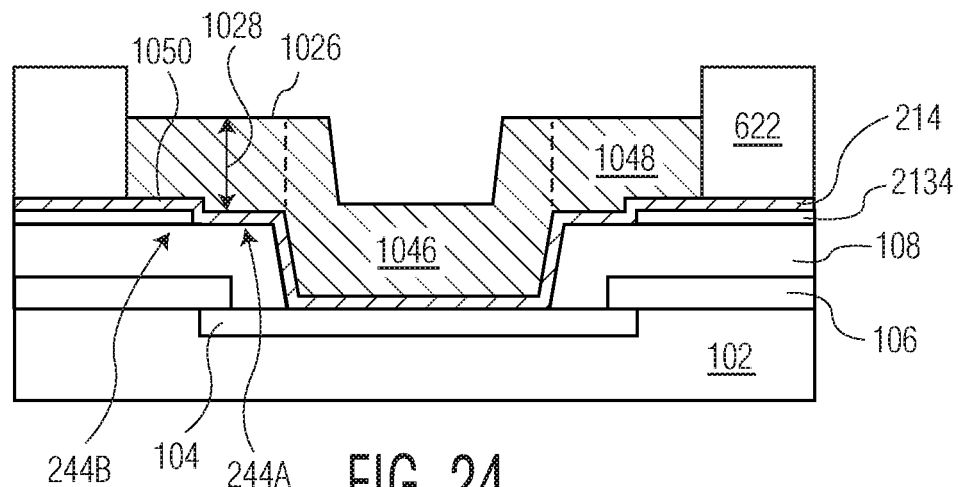

FIG. 24 shows the device structure after a plating step is performed, forming solder ball pad 1026 to a desired thickness 1028 within opening 625 on seed layer 214, where solder ball pad 1026 includes an inner region 1046 formed within opening 110 and an outer region 1048 formed outside of opening 110, similar to that described above in connection with FIG. 10. The bottom surface 1050 of outer region 1048 contacts top surface 109 of the underlying dielectric layer 108 within the inner section 244A of region 244 and contacts a top surface of the underlying sacrificial layer 2134 within the outer section 244B of region 244. FIG. 25 shows the device structure after the photoresist layer 622 is removed, and after any portion of seed layer 214 outside of outer region 1048 (or outside of outer edge 245 of solder ball pad 1026) is removed, similar to that described above in connection with FIG. 10. A remaining seed layer portion 2514 is left under the solder ball pad 1026, which includes region 244 formed under outer region 1048. As shown in FIG. 25, removal of the seed layer 214 outside of outer region 1048 exposes the top surface 2133 of sacrificial layer 2134.

FIG. 26 shows the device structure after removal of sacrificial layer 2134, which exposes the top surface 109 of underlying dielectric layer 108. The removal of sacrificial layer 2134 from under region 244B of seed layer portion 2514 forms a lateral opening 2636 under the outer edge of solder ball pad 1026. The lateral opening 2636 exposes a bottom surface 2615 of a portion of seed layer portion 2514 in region 244B that underlies outer region 1048. Since seed layer portion 2514 acts as an adhesion layer for the solder ball pad 1026, adhesion is reduced by lateral opening 2636.

In the embodiment shown, zero adhesion is achieved in region 244B, while seed layer portion 2514 in region 244A provides adequate adhesion for the solder ball pad 1026. The stresses introduced into dielectric layer 108 by solder ball pad's expansion or contraction are greatly reduced due to the reduced adhesion around the outer region 1048 of solder ball pad 1026, which reduces the risk of damaging dielectric layer 108. FIG. 27 then shows the device structure after ball drop is performed, where solder ball 1130 is dropped onto solder ball pad 1026, similar to that described above in connection with FIG. 11. In some embodiments, removal of sacrificial layer 2134 may be performed after ball drop in FIG. 27, if the sacrificial material of sacrificial layer 2134 can withstand the reflow process (e.g., can withstand reflow temperatures).

Returning to FIG. 26, sacrificial layer 2134 may be removable by a number of methods, depending on the sacrificial material used, such as exposure to heat, to light, to a solvent, to water, or any combination thereof. For example, a heat-sensitive polymer such as a polyalkylene carbonate sacrificial dielectric material may decompose after extended exposure (e.g., 8 hours) to a temperature in the range of 175 C to 200 C (which is provided as a non-limiting example). Other heat-sensitive polymers may need to be rinsed away with water after heat exposure. A water-soluble sacrificial material may be removed by exposure to a solvent and then rinsed with water. An ultraviolet (UV) light sensitive sacrificial material may be removed by exposure to UV light. In other embodiments, sacrificial material removal may include etching away the sacrificial layer 214 using a wet etchant selectively targeted to the sacrificial material that forms the sacrificial layer 2134.

Figure 28:
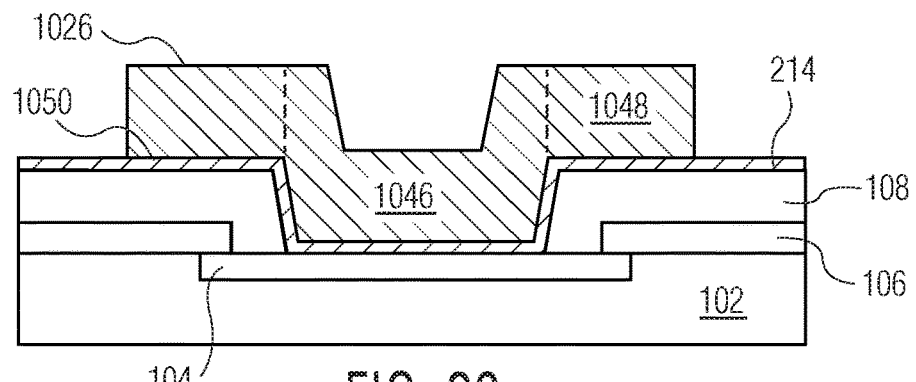
FIGS. 28-30 are diagrams depicting still another example fabrication process for implementing low stress pad structures for a packaged semiconductor device, according to some embodiments of the present disclosure.
Figure 29:
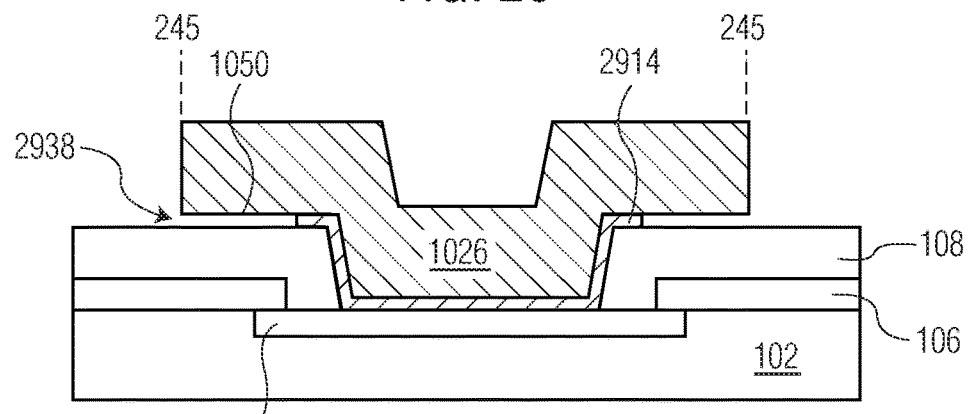
Figure 30:
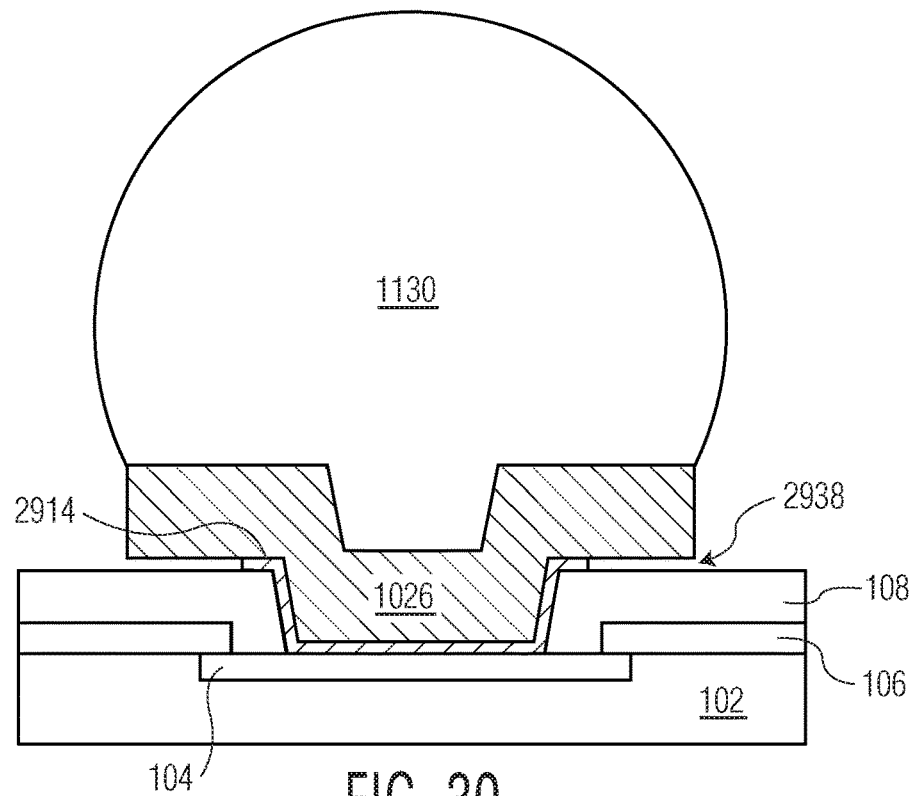

FIGS. 28-30 show various steps of yet another example process performed on a device structure to fabricate a low stress pad structure for solder ball attachment like that shown in FIG. 30, where the device structure and low stress pad structure (also referred to as a solder ball pad herein) may be part of a packaged semiconductor device. The process steps shown in FIGS. 28-30 are performed after process steps similar to those shown in FIGS. 12-15 are performed. For example, FIG. 15 shows the device structure after a plating step is performed, forming solder ball pad 1026 on seed layer 214 within opening 625 of photoresist layer 622, where solder ball pad 1026 includes an inner region 1046 formed within opening 110 and an outer region 1048 formed outside of opening 110. FIG. 28 shows the device structure after the photoresist layer 622 is removed, similar to that described above in connection with FIG. 16.

FIG. 29 shows the device structure after an etching step is performed. The etching step removes a portion of seed layer 214 outside of outer region 1048 (or outside of outer edge 245 of solder ball pad 1026). The etching step also removes a portion of seed layer 214 under a portion of the outer region 1048 of solder ball pad 1026, leaving a remaining seed layer portion 2914 under the solder ball pad 1026. The etching step of FIG. 29 uses an etchant that is selectively targeted to the conductive material(s) that forms seed layer 214. For example, the device structure may be subjected to a selective adhesion metal etching step, such as a chemical etching process based on hydrogen peroxide to selectively remove the first layer used for adhesion (e.g., Ti or TiW). Removal of seed layer 214 from under a portion of the outer region 1048 forms a lateral opening or air gap 2938 under the outer edge of solder ball pad 1026. The lateral opening 2938 extends under a portion of outer region 1048 by some distance. The general size of the lateral opening 2938 is dependent on the chemical concentration of the etchant used, the temperature, and the exposure time. The lateral opening 2938 exposes a bottom surface 1050 of the outer region 1048 of solder ball pad 1026. Since the seed layer portion 2914 acts as an adhesion layer for the solder ball pad 1026, adhesion is reduced by lateral opening 2938. In the embodiment shown, zero adhesion is achieved in the portion of outer region 1048, while seed layer portion 2914 provides adequate adhesion for the solder ball pad 1026. The stresses introduced into the dielectric layer 108 by solder ball pad's expansion or contraction are greatly reduced due to the reduced adhesion around the outer region 1048 of solder ball pad 1026, which reduces the risk of damaging dielectric layer 108. FIG. 30 then shows the device structure after ball drop is performed, where solder ball 1130 is dropped onto solder ball pad 1026, similar to that described above in connection with FIG. 11. In other embodiments, adhesion layer removal may be performed after ball drop.

FIGS. 31 and 32 show another example embodiment using the teachings of elongated openings formed in a seed layer of a solder ball pad to reduce adhesion, which were discussed in further detail above in connection with FIGS. 1A-11. FIG. 31 shows a cross-sectional view and FIG. 32 shows a top down view of an example conductive structure 3126 formed in an redistributed layer (RDL) structure, where the conductive structure 3126 includes a solder ball pad 3148 formed at one end (shown on the right), a trace portion 3150 that extends from the solder ball pad 3148 to a die pad 104, and a via 1046 that directly contacts die pad 104 at the opposite end (shown on the left). The RDL structure shown in FIG. 31 includes a number of build-up layers, such as dielectric layers 106, 108, and 3108, and metal layers that are patterned into conductive structure 3126 and underlying patterned seed layer 3114. Dielectric layers are omitted from FIG. 32 to clearly show the conductive structure 3126, which is shown in simplified form. In other embodiments, trace portion 3150 of conductive structure 3126 may include a more complex routing path.

Seed layer 3114 includes a center portion 3146 and a ring portion 3144 around center portion 3146, on which a solder ball pad 3148 is formed. Seed layer 3114 is patterned with elongated openings 3118 and 3120 within region 3144, which are shown in dashed outline in FIG. 32. A thick metal layer is then plated over seed layer 3114 within an opening of a photoresist (similar to that discussed above) to form conductive structure 3126, which fills in elongated openings 3118 and 3120 and contacts the top surface 109 of the underlying dielectric layer 108. Elongated openings 3118 and 3120 reduce adhesion under solder ball pad 3148 and allow for expansion of the solder ball pad at a different rate than the surrounding materials. In the embodiment shown, seed layer ring portion 3144 is continuous under trace portion 3150 and under via 1046. In other embodiments, seed layer ring portion 3144 may include another set of elongated openings around via 1046, in a manner similar to that shown in FIG. 10. Dielectric layer 3108 covers the conductive structure 3126, with an opening exposing a surface or contact area of solder ball pad 3148, to which solder ball 1130 is attached. While FIGS. 31 and 32 show the solder ball pad formed over the die 102, solder ball pad 3148 may be formed over a package body that laterally surrounds the die 102, in other embodiments.

FIGS. 33 and 34 show another example embodiment using the teachings of elongated openings formed in a seed layer to reduce adhesion. FIG. 33 shows a cross-sectional view and FIG. 34 shows a top down view of an example conductive structure 3326 formed in an RDL structure, where the conductive structure 3326 includes a ground plane 3348. In the embodiment shown, ground plane 3348 directly contacts die pad 104 through via 1046 (shown on the left). The RDL structure shown in FIG. 33 includes a number of build-up layers, such as dielectric layers 106, 108, and 3308, and metal layers that patterned into conductive structure 3326 and underlying patterned seed layer 3314. Dielectric layers are omitted from FIG. 34 to clearly show the conductive structure 3326.

Seed layer 3314 is patterned with elongated openings 3318, 3320, and 3322 within the region 3344 that underlies ground plane 3348, which are shown in dashed outline in FIG. 34. A thick metal layer is plated over seed layer 3314 within an opening of a photoresist (similar to that discussed above) to form conductive structure 3326, which fills in elongated openings 3318, 3320, and 3322 and contacts the top surface 109 of the underlying dielectric layer 108. Elongated openings 3318, 3320, and 3322 reduce adhesion under ground plane and allow for expansion of the ground plane at a different rate than the surrounding materials. While elongated openings 3318, 3320, and 3322 are shown as straight segments, elongated openings in other embodiments may be differently shaped, including curved segments.

The fabrication process steps discussed herein may be implemented using a sequence of numerous process steps applied to a wafer or panel or substrate or device, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. Examples of integrated circuit components include but are not limited to a processor, memory, logic, analog circuitry, sensor, MEMS (microelectromechanical systems) device, a standalone discrete device such as a resistor, inductor, capacitor, diode, power transistor, and the like. In some embodiments, the active circuitry may be a combination of the integrated circuit components listed above or may be another type of microelectronic device.

By now it should be appreciated that there has been provided low stress structures that allow thick metal layers in a packaged semiconductor device to expand and contract at different rates than the surrounding materials, such as by reducing adhesion of the thick metal layer from the underlying dielectric material. In some embodiments, adhesion may be reduced by implementing elongated openings under a thick metal layer such as a pad structure, a redistributed layer (RDL) pad structure, or a ground plane. In other embodiments, adhesion may be reduced by releasing a portion of the thick metal layer from the underlying dielectric material, such as around an edge of a solder ball pad.

In one embodiment of the present disclosure, a packaged semiconductor device is provided, which includes: a low stress pad structure including: a dielectric layer, a seed layer having: a center section, and a ring section formed around the center section and over a top surface of the dielectric layer, wherein the ring section of the seed layer includes a set of elongated openings through which a portion of the top surface of the dielectric layer is exposed, and a metal layer having: an inner section formed over a top surface of the center section of the seed layer, and an outer section formed over a top surface of the ring section of the seed layer, wherein a bottom surface of the outer section of the metal layer directly contacts the portion of the top surface of the dielectric layer exposed through the set of elongated openings.

One aspect of the above embodiment provides that a remaining portion of the seed layer around the one or more elongated openings is continuous within the ring section.

Another aspect of the above embodiment provides that the inner and outer sections of the metal layer are plated onto the center and ring sections of the seed layer sections.

Another aspect of the above embodiment provides that the set of elongated openings include one or more elongated openings around the center section within the ring section of the seed layer.

Another aspect of the above embodiment provides that the set of elongated openings include: a set of first elongated openings in the ring section of the seed layer that are formed at a first distance away from a perimeter of the center section, and a set of second elongated openings in the ring section of the seed layer that are formed at a second distance away from the perimeter of the center section, the second distance greater than the first distance.

Another aspect of the above embodiment provides that the packaged semiconductor device further includes: a semiconductor die includes a plurality of bond pads on an active side of the semiconductor die, wherein the dielectric layer is formed over the active side of the semiconductor die, a first bond pad of the plurality of bond pads is exposed through an opening in the dielectric layer, and the center section of the seed layer is formed within the opening and directly contacts a surface of the first bond pad.

A further aspect of the above embodiment provides that the inner section of the metal layer is further formed within the opening, the outer section of the metal layer is further formed around the opening over the dielectric layer, and the inner and outer sections of the metal layer form a solder ball pad on the first bond pad.

Another aspect of the above embodiment provides that the low stress pad structure further includes: a second dielectric layer that covers the metal layer, wherein a contact surface of the metal layer is exposed through the second dielectric layer to form a solder ball pad.

A further aspect of the above embodiment provides that the packaged semiconductor device further includes: a semiconductor die includes a plurality of bond pads on an active side of the semiconductor die, wherein the dielectric layer is formed over the active side of the semiconductor die, a first bond pad of the plurality of bond pads is exposed through an opening in the dielectric layer, and wherein the low stress pad structure further includes: a via section formed within the opening in the dielectric layer, and a trace section connected between the via section and the solder ball pad.

A still further aspect of the above embodiment provides that the via section and the trace section each include an underlying portion of the seed layer and a portion of the metal layer, wherein the portion of metal layer is plated onto the underlying portion of the seed layer.

Another still further aspect of the above embodiment provides that a second ring section in the seed layer around the via section includes a second set of elongated openings through which a portion of the top surface of the dielectric layer is exposed.

Another aspect of the above embodiment provides that the packaged semiconductor device further includes: a solder ball attached to the metal layer.

Another aspect of the above embodiment provides that the packaged semiconductor device is one of a plurality of devices fabricated as part of a wafer.

In another embodiment of the present disclosure, a packaged semiconductor device is provided, which includes: a semiconductor die that includes a plurality of bond pads on an active side of the semiconductor die; and a low stress pad structure that includes: a dielectric layer formed over the active side of the semiconductor die, a first bond pad exposed through an opening in the dielectric layer, a seed layer having: a center section formed within the opening that directly contacts a surface of the first bond pad, and a ring section formed over a top surface of the dielectric layer around the opening, and a solder ball pad having: an inner section formed over a top surface of the center section of the seed layer, and an outer section formed over a top surface of the ring section of the seed layer, wherein a lateral opening extends under the outer section of the solder ball pad.

One aspect of the above embodiment provides that the lateral opening extends into a portion of the dielectric layer underneath a portion of the ring section of the seed layer that underlies the outer section of the solder ball pad.

Another aspect of the above embodiment provides that the lateral opening is formed by removal of a sacrificial layer between the dielectric layer and a portion of the ring section of the seed layer that underlies the outer section of the solder ball pad.

A further aspect of the above embodiment provides that the lateral opening exposes a bottom surface of the portion of the ring section of the seed layer.

Another aspect of the above embodiment provides that the lateral opening is formed by removal of a portion of the ring section of the seed layer that underlies the outer section of the solder ball pad.

A further aspect of the above embodiment provides that the lateral opening exposes a bottom surface of a portion of the outer section of the solder ball pad.

In another embodiment of the present disclosure, a packaged semiconductor device is provided, which includes: a low stress structure that includes: a dielectric layer, a seed layer having: a low adhesion section formed over a top surface of the dielectric layer, wherein the low adhesion section of the seed layer includes a set of elongated openings through which a portion of the top surface of the dielectric layer is exposed, and a metal layer having: a plated section formed over a top surface of the low adhesion section of the seed layer, wherein a bottom surface of the plated section of the metal layer directly contacts the portion of the top surface of the dielectric layer exposed through the set of elongated openings.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

It is noted that the term "neighboring" as used herein means "adjacent to" (e.g., next to and without an intervening object), and "laterally" as used herein means "in a sideways direction" (e.g., a horizontal direction that is parallel to a plane of the substrate).

Although the invention is described herein with reference to specific embodiments, various modifications and changes can be made without departing from the scope of the present invention as set forth in the claims below. For example, additional or fewer dielectric and conductive build-up layers may be implemented in FIG. 11. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged semiconductor device comprising:
   a low stress pad structure comprising:
      a dielectric layer,
      a seed layer having:
         a center section, and
         a ring section formed around the center section and over a top surface of the dielectric layer, wherein the ring section of the seed layer includes a set of elongated openings through which a portion of the top surface of the dielectric layer is exposed, and
      a metal layer having:
         an inner section formed over a top surface of the center section of the seed layer, and
         an outer section formed over a top surface of the ring section of the seed layer, wherein a bottom surface of the outer section of the metal layer directly contacts the portion of the top surface of the dielectric layer exposed through the set of elongated openings.

2. The packaged semiconductor device of claim 1, wherein
   a remaining portion of the seed layer around the one or more elongated openings is continuous within the ring section.

3. The packaged semiconductor device of claim 1, wherein
   the inner and outer sections of the metal layer are plated onto the center and ring sections of the seed layer sections.

4. The packaged semiconductor device of claim 1, wherein
   the set of elongated openings comprise one or more elongated openings around the center section within the ring section of the seed layer.

5. The packaged semiconductor device of claim 1, wherein
   the set of elongated openings comprise:
      a set of first elongated openings in the ring section of the seed layer that are formed at a first distance away from a perimeter of the center section, and
      a set of second elongated openings in the ring section of the seed layer that are formed at a second distance away from the perimeter of the center section, the second distance greater than the first distance.

6. The packaged semiconductor device of claim 1, further comprising:
   a semiconductor die comprising a plurality of bond pads on an active side of the semiconductor die, wherein
      the dielectric layer is formed over the active side of the semiconductor die,
      a first bond pad of the plurality of bond pads is exposed through an opening in the dielectric layer, and
      the center section of the seed layer is formed within the opening and directly contacts a surface of the first bond pad.

7. The packaged semiconductor device of claim 6, wherein
   the inner section of the metal layer is further formed within the opening,
   the outer section of the metal layer is further formed around the opening over the dielectric layer, and
   the inner and outer sections of the metal layer form a solder ball pad on the first bond pad.

8. The packaged semiconductor device of claim 1, wherein the low stress pad structure further comprises:
   a second dielectric layer that covers the metal layer, wherein a contact surface of the metal layer is exposed through the second dielectric layer to form a solder ball pad.

9. The packaged semiconductor device of claim 8, further comprising:
   a semiconductor die comprising a plurality of bond pads on an active side of the semiconductor die, wherein
      the dielectric layer is formed over the active side of the semiconductor die,
      a first bond pad of the plurality of bond pads is exposed through an opening in the dielectric layer, and
   wherein the low stress pad structure further comprises:
      a via section formed within the opening in the dielectric layer, and
      a trace section connected between the via section and the solder ball pad.

10. The packaged semiconductor device of claim 9, wherein
    the via section and the trace section each include an underlying portion of the seed layer and a portion of the metal layer, wherein the portion of metal layer is plated onto the underlying portion of the seed layer.

11. The packaged semiconductor device of claim 10, wherein
    a second ring section in the seed layer around the via section comprises a second set of elongated openings through which a portion of the top surface of the dielectric layer is exposed.

12. The packaged semiconductor device of claim 1, further comprising:
    a solder ball attached to the metal layer.

13. The packaged semiconductor device of claim 1, wherein
    the packaged semiconductor device is one of a plurality of devices fabricated as part of a wafer.

14. A packaged semiconductor device comprising:
a semiconductor die comprising a plurality of bond pads on an active side of the semiconductor die; and
a low stress pad structure comprising:
a dielectric layer formed over the active side of the semiconductor die, a first bond pad exposed through an opening in the dielectric layer,
a seed layer having:
a center section formed within the opening that directly contacts a surface of the first bond pad, and
a ring section formed over a top surface of the dielectric layer around the opening, and
a solder ball pad having:
an inner section formed over a top surface of the center section of the seed layer, and
an outer section formed over a top surface of the ring section of the seed layer, wherein
a lateral opening extends under the outer section of the solder ball pad.

15. The packaged semiconductor device of claim 14, wherein
the lateral opening extends into a portion of the dielectric layer underneath a portion of the ring section of the seed layer that underlies the outer section of the solder ball pad.

16. The packaged semiconductor device of claim 14, wherein
the lateral opening is formed by removal of a sacrificial layer between the dielectric layer and a portion of the ring section of the seed layer that underlies the outer section of the solder ball pad.

17. The packaged semiconductor device of claim 16, wherein
the lateral opening exposes a bottom surface of the portion of the ring section of the seed layer.

18. The packaged semiconductor device of claim 14, wherein
the lateral opening is formed by removal of a portion of the ring section of the seed layer that underlies the outer section of the solder ball pad.

19. The packaged semiconductor device of claim 18, wherein
the lateral opening exposes a bottom surface of a portion of the outer section of the solder ball pad.

20. A packaged semiconductor device comprising:
a low stress structure comprising:
a dielectric layer,
a seed layer having:
a low adhesion section formed over a top surface of the dielectric layer, wherein the low adhesion section of the seed layer includes a set of elongated openings through which a portion of the top surface of the dielectric layer is exposed, and
a metal layer having:
a plated section formed over a top surface of the low adhesion section of the seed layer, wherein a bottom surface of the plated section of the metal layer directly contacts the portion of the top surface of the dielectric layer exposed through the set of elongated openings.

* * * * *